US012641790B2

(12) United States Patent
Kang et al.

(10) Patent No.: US 12,641,790 B2
(45) Date of Patent: May 26, 2026

(54) THREE-DIMENSIONAL SEMICONDUCTOR MEMORY DEVICE WITH DIFFUSION STOP LAYER AND ELECTRONIC SYSTEM INCLUDING THE SAME

(71) Applicant: Samsung Electronics Co., Ltd., Suwon-si (KR)

(72) Inventors: Sangmin Kang, Suwon-si (KR); Bio Kim, Seoul (KR); Hyung Joon Kim, Pyeongtaek-si (KR); Kyungwook Park, Suwon-si (KR)

(73) Assignee: Samsung Electronics Co. Ltd., Suwon-si (KR)

( * ) Notice: Subject to any disclaimer, the term of this patent is extended or adjusted under 35 U.S.C. 154(b) by 383 days.

(21) Appl. No.: 18/154,982

(22) Filed: Jan. 16, 2023

(65) Prior Publication Data

US 2023/0247836 A1     Aug. 3, 2023

(30) Foreign Application Priority Data

Jan. 26, 2022     (KR) ........................ 10-2022-0011724

(51) Int. Cl.
    H10B 43/27          (2023.01)
    H10B 43/10          (2023.01)
        (Continued)

(52) U.S. Cl.
    CPC ............. H10B 43/27 (2023.02); H10B 43/10 (2023.02); H10B 43/35 (2023.02); H10B 43/40 (2023.02)

(58) Field of Classification Search
    CPC . H01L 27/1027; H01L 27/1028; H10B 53/00;
    H10B 53/10; H10B 53/20; H10B 53/30;
    H10B 53/40; H10B 53/50; H10B 41/00;
    H10B 41/10; H10B 41/20; H10B 41/23;
    H10B 41/27; H10B 41/30; H10B 41/35;
    H10B 41/40–44; H10B 41/46–50; H10B
    41/60; H10B 41/70; H10B 43/00; H10B
        43/10; H10B 43/20; H10B 43/23;
        (Continued)

(56) References Cited

U.S. PATENT DOCUMENTS 8,928,144 B2     1/2015  Kim
9,240,357 B2     1/2016  Kim et al.
        (Continued)

FOREIGN PATENT DOCUMENTS

KR      2013-0070930 A      6/2013
KR      2018-0032036 A      3/2018

*Primary Examiner* — William B Partridge
*Assistant Examiner* — Gustavo G Ramallo
(74) *Attorney, Agent, or Firm* — Fish & Richardson P.C.

(57)          ABSTRACT

Disclosed are 3D semiconductor memory devices and electronic systems including the same. The 3D semiconductor memory device comprises a stack structure including interlayer dielectric layers and gate electrodes that are alternately and repeatedly stacked on a substrate, vertical channel structures in vertical channel holes that penetrate the stack structure and each including a charge storage layer, a tunneling dielectric layer, and a vertical semiconductor pattern that are sequentially cover an inner sidewall of each of the vertical channel holes, and a diffusion stop layer between the gate electrodes and the charge storage layer. The diffusion stop layer includes a dielectric material having a dielectric constant of greater than about 0 and less than about 5.

20 Claims, 26 Drawing Sheets

(51) Int. Cl.
H10B 43/35 (2023.01)
H10B 43/40 (2023.01)

(58) Field of Classification Search
CPC ........ H10B 43/27; H10B 43/30; H10B 43/35;
H10B 43/40; H10B 43/50; H10B 51/00;
H10B 51/10; H10B 51/20; H10B 51/30;
H10B 51/40; H10B 51/50
See application file for complete search history.

(56) References Cited

U.S. PATENT DOCUMENTS

| | | | |
|---|---|---|---|
| 9,281,414 B2 | 3/2016 | Won et al. | |
| 9,997,372 B2 | 6/2018 | Briggs et al. | |
| 10,297,611 B1 | 5/2019 | Wells et al. | |
| 10,453,855 B2 | 10/2019 | Carlson et al. | |
| 2011/0101438 A1 | 5/2011 | Yoo et al. | |
| 2011/0103149 A1* | 5/2011 | Katsumata ............. | G11C 16/06 365/185.18 |
| 2013/0270625 A1* | 10/2013 | Jang .................... | H10D 30/693 257/324 |
| 2015/0179662 A1* | 6/2015 | Makala .................. | H10B 41/27 257/314 |
| 2015/0263126 A1* | 9/2015 | Shingu ............. | H01L 21/28518 438/264 |
| 2016/0148947 A1* | 5/2016 | Seo ........................ | H10B 43/27 257/324 |
| 2017/0069647 A1* | 3/2017 | Ohashi ............... | H10D 30/0413 |
| 2017/0148800 A1* | 5/2017 | Nishikawa ............. | H10B 43/27 |
| 2019/0198510 A1* | 6/2019 | Kim ...................... | H10B 41/27 |
| 2021/0028187 A1 | 1/2021 | Byeon et al. | |

* cited by examiner

THREE-DIMENSIONAL SEMICONDUCTOR MEMORY DEVICE WITH DIFFUSION STOP LAYER AND ELECTRONIC SYSTEM INCLUDING THE SAME

CROSS-REFERENCE TO RELATED APPLICATION

This U.S. nonprovisional application claims priority under 35 U.S.C § 119 to Korean Patent Application No. 10-2022-0011724 filed on Jan. 26, 2022 in the Korean Intellectual Property Office, the disclosure of which is hereby incorporated by reference in its entirety.

BACKGROUND

Example embodiments relate, in general, to a three-dimensional semiconductor memory device and/or an electronic system including the same, and more particularly, to a nonvolatile three-dimensional semiconductor memory device including a vertical channel structure, a method of fabricating the same, and/or an electronic system including the same.

It may be necessary or desirable to have a semiconductor device capable of storing a large amount of data in an electronic system which requires or uses data storage. Semiconductor devices have been highly integrated to meet high performance and low manufacturing cost which are required by customers. Integration of typical two-dimensional or planar semiconductor devices is determined or primarily determined by the area occupied by a unit memory cell, such that it is greatly influenced by the level of technology for forming fine patterns. However, various equipment, such as expensive or extremely processing equipment needed or used to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some examples of inventive concepts provide a three-dimensional semiconductor memory device with improved electrical properties and/or increased reliability, and/or a method of fabricating the same.

Alternatively or additionally, some example embodiments provide an electronic system including the three-dimensional semiconductor memory device.

Objects of example embodiments are not limited to the mentioned above, and other objects which have not been mentioned above will be clearly understood to those of ordinary skill in the art from the following description.

According to some example embodiments, a three-dimensional semiconductor memory device may include a stack structure including interlayer dielectric layers and gate electrodes that are alternately and repeatedly stacked on a substrate, wherein the gate electrodes are between the interlayer dielectric layers; vertical channel structures in vertical channel holes that penetrate the stack structure, wherein each of the vertical channel structures includes a charge storage layer, a tunneling dielectric layer, and a vertical semiconductor pattern that are sequentially cover an inner sidewall of each of the vertical channel holes; and a diffusion stop layer between the gate electrodes and the charge storage layer. The diffusion stop layer may include a dielectric material having a dielectric constant of greater than about 0 and less than about 5.

According to various example embodiments, a three-dimensional semiconductor memory device may include a stack structure including interlayer dielectric layers and gate electrodes that are alternately and repeatedly stacked on a substrate, wherein the gate electrodes are between the interlayer dielectric layers; vertical channel structures in vertical channel holes that penetrate the stack structure, wherein each of the vertical channel structures includes a first blocking dielectric layer, a first diffusion stop layer, a charge storage layer, a tunneling dielectric layer, and a vertical semiconductor pattern that are sequentially cover an inner sidewall of each of the vertical channel holes; and a second diffusion stop layer and a second blocking dielectric layer between the gate electrodes and the first blocking dielectric layer. Each of the first blocking dielectric layer and the second blocking dielectric layer may include an oxide dielectric layer. Each of the first diffusion stop layer and the second diffusion stop layer may include a non-oxide dielectric layer.

According to some example embodiments, an electronic system may include a three-dimensional semiconductor memory device including a substrate, a peripheral circuit structure on the substrate, and a cell array structure on the peripheral circuit structure; and a controller electrically connected through an input/output pad to the three-dimensional semiconductor memory device, wherein the controller is configured to control the three-dimensional semiconductor memory device. The cell array structure may include a stack structure including interlayer dielectric layers and gate electrodes that are alternately and repeatedly stacked on the peripheral circuit structure, wherein the gate electrodes are between the interlayer dielectric layers; vertical channel structures in vertical channel holes that penetrate the stack structure, wherein each of the vertical channel structures includes a charge storage layer, a tunneling dielectric layer, and a vertical semiconductor pattern that sequentially cover an inner sidewall of each of the vertical channel holes; and a diffusion stop layer between the gate electrodes and the charge storage layer. The diffusion stop layer includes a non-oxide dielectric layer having a dielectric constant of greater than about 0 and less than about 5.

BRIEF DESCRIPTION OF THE DRAWINGS

FIG. 2 illustrates a simplified perspective view showing an electronic system that includes a three-dimensional semiconductor memory device according to various example embodiments.

FIGS. 3 and 4 illustrate cross-sectional views respectively taken along lines I-I' and II-II' of FIG. 2, showing a semiconductor package that includes a three-dimensional semiconductor memory device according to various example embodiments.

FIGS. 9 to 11A illustrate cross-sectional views taken along line I-I' of FIG. 5, showing a method of fabricating a three-dimensional semiconductor memory device according to various example embodiments.

DETAIL PARTED DESCRIPTION OF EXAMPLE EMBODIMENTS

The following will now describe in detail a three-dimensional semiconductor memory device, a method of fabricating the same, and an electronic system including the same according to various example embodiments in conjunction with the accompanying drawings.

Figure 1:
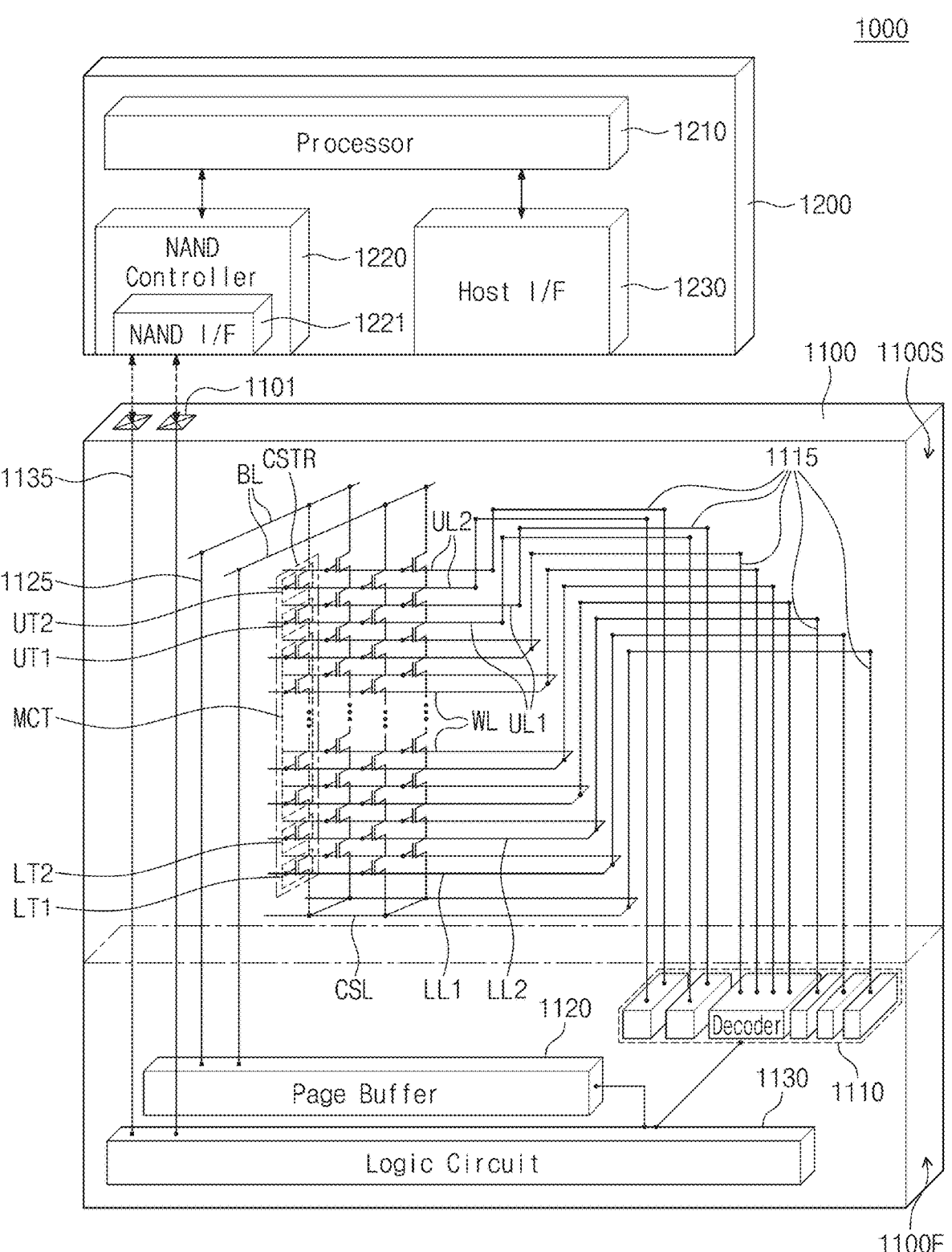
FIG. 1 illustrates a simplified block diagram showing an electronic system that includes a three-dimensional semiconductor memory device according to various example embodiments.

FIG. 1 illustrates a simplified block diagram showing an electronic system that includes a three-dimensional semiconductor memory device according to various example embodiments.

Referring to FIG. 1, an electronic system 1000 according to various example embodiments may include a three-dimensional semiconductor memory device 1100 and a controller 1200 electrically connected to the three-dimensional semiconductor memory device 1100. The electronic system 1000 may be or may include a storage device that includes a single or a plurality of three-dimensional semiconductor memory devices 1100, and/or may be or may include an electronic device that includes the storage device. For example, the electronic system 1000 may be or include one or more of a solid-state drive (SSD) device, a universal serial bus (USB), a computing system, a medical apparatus, or a communication apparatus each of which includes a single or a plurality of three-dimensional semiconductor memory devices 1100.

The three-dimensional semiconductor memory device 1100 may be or may include a nonvolatile memory device, such as a three-dimensional NAND Flash memory device which will be discussed below. The three-dimensional semiconductor memory device 1100 may include a first region 1100F and a second region 1100S on the first region 1100F. For example, the first region 1100F may be disposed on a side of the second region 1100S. The first region 1100F may be or may correspond to a peripheral circuit region that includes a decoder circuit 1110, a page buffer 1120, and a logic circuit 1130. The second region 1100S may be or may correspond to a memory cell region that includes bit lines BL, a common source line CSL, word lines WL, first lines LL1 and LL2, second lines UL1 and UL2, and memory cell strings CSTR between the bit line BL and the common source line CSL.

On the second region 1100S, each of the memory cell strings CSTR may include first transistors LT1 and LT2 adjacent to the common source line CSL, second transistors UT1 and UT2 adjacent to the bit line BL, and memory cell transistors MCT disposed between the first transistors LT1 and LT2 and the second transistors UT1 and UT2. The number of the first transistors LT1 and LT2 and of the second transistors UT1 and UT2 may be variously changed in accordance with embodiments. Electrical characteristics, such as threshold voltages, of the first transistors LT1 may be the same as or different from electrical characteristics of the second transistors LT2.

For example, the first transistors LT1 and LT2 may include a ground selection transistor, and the second transistors UT1 and UT2 may include a string selection transistor. The first lines LL1 and LL2 may be or may correspond to gate electrodes of the first transistors LT1 and LT2, respectively. The word lines WL may be or may correspond to gate electrodes of the memory cell transistors MCT. The second lines UL1 and UL2 may be or may correspond to gate electrodes of the second transistors UT1 and UT2, respectively.

For example, the first transistors LT1 and LT2 may include a first erase control transistor LT1 and a ground selection transistor LT2 that are connected in series. The second transistors UT1 and UT2 may include a string selection transistor UT1 and a second erase control transistor UT2 that are connected in series. One or both of the first and second erase control transistors LT1 and UT2 may be employed to perform an erase operation in which a gate induced drain leakage (GIDL) phenomenon is used to erase data, such as logical '1' or logical '0', that is stored in the memory cell transistors MCT.

The common source line CSL, the first lines LL1 and LL2, the word lines WL, and the second lines UL1 and UL2 may be electrically connected to the decoder circuit 1110 through first connection lines 1115 that extend from the first region 1100F toward the second region 1100S. The bit lines BL may be electrically connected to the page buffer 1120 through second connection lines 1125 that extend from the first region 1100F toward the second region 1100S.

On the first region 1100F, the decoder circuit 1110 and the page buffer 1120 may perform a control operation to at least one selection memory cell transistor among the plurality of memory cell transistors MCT. The logic circuit 1130 may control the decoder circuit 1110 and the page buffer 1120. The three-dimensional semiconductor memory device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first region 1100F toward the second region 1100S.

The controller 1200 may include a processor 1210, a NAND controller 1220, and a host interface 1230. For example, the electronic system 1000 may include a plurality of three-dimensional semiconductor memory devices 1100, and in this case, the controller 1200 may control (e.g. independently control) the plurality of three-dimensional semiconductor memory devices 1100.

The processor 1210 may control an overall operation of the electronic system 1000 that includes the controller 1200. The processor 1210 may operate based on certain firmware, and may control the NAND controller 1220 to access the three-dimensional semiconductor memory device 1100. The NAND controller 1220 may include NAND interface 1221 that processes communication with the three-dimensional semiconductor memory device 1100. The NAND interface 1221 may be used to transfer therethrough a control command which is intended to control the three-dimensional semiconductor memory device 1100, data which is intended to be written on the memory cell transistors MCT of the three-dimensional semiconductor memory device 1100, and/or data which is intended to be read from the memory cell transistors MCT of the three-dimensional semiconductor memory device 1100. The host interface 1230 may provide the electronic system 1000 with communication with an external host. When a control command is received through the host interface 1230 from an external host, the three-dimensional semiconductor memory device 1100 may be controlled by the processor 1210 in response to the control command.

Figure 2:
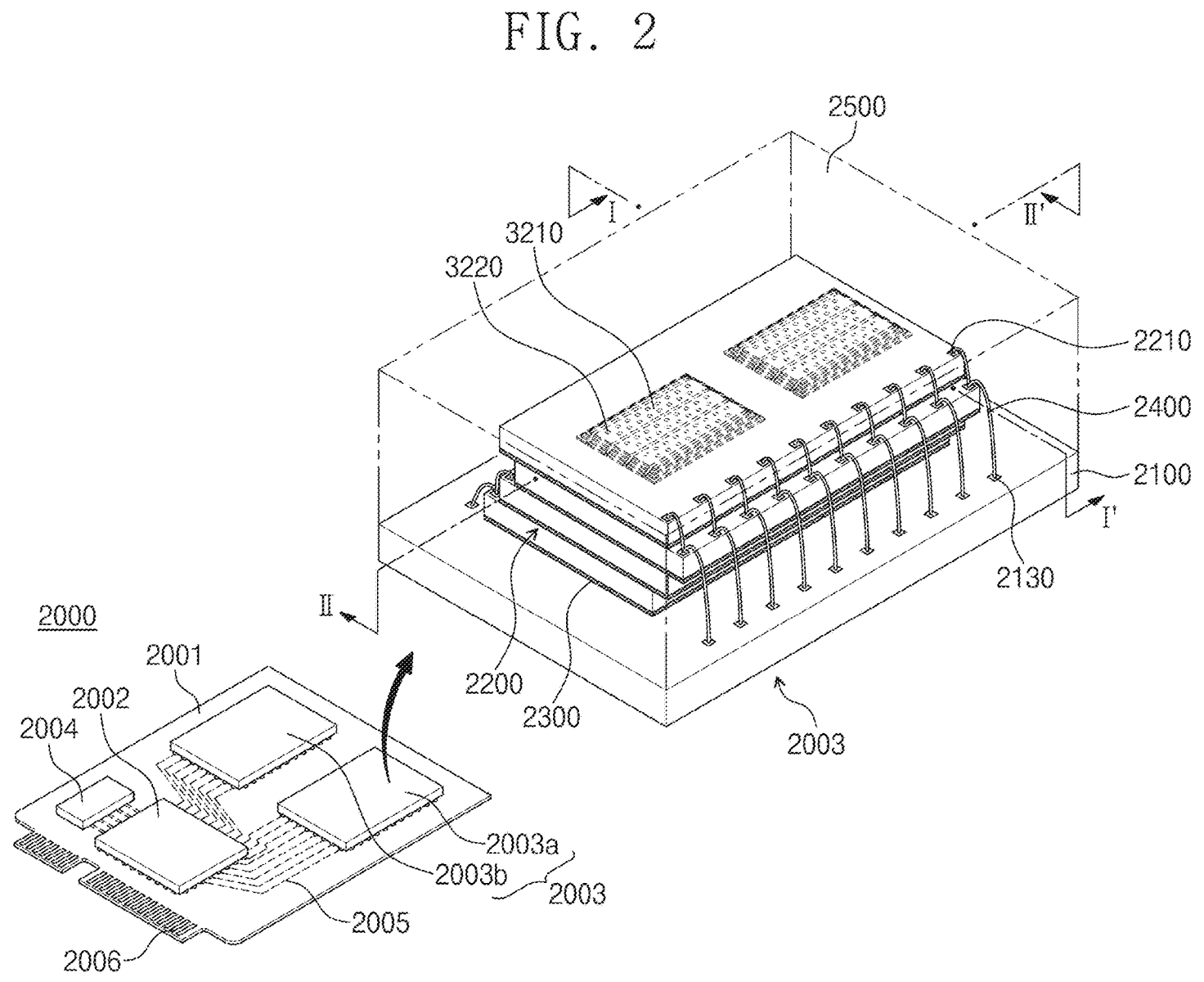

FIG. 2 illustrates a simplified perspective view showing an electronic system that includes a three-dimensional semiconductor memory device according to various example embodiments.

Referring to FIG. 2, an electronic system 2000 according to various example embodiments may include a main board 2001, a controller 2002 on (e.g. mounted on) the main board 2001, one or more semiconductor packages 2003, and a dynamic random access memory (DRAM) 2004. The semiconductor package 2003 and the DRAM 2004 may be connected to the controller 2002 through wiring patterns 2005 provided in the main board 2001.

The main board 2001 may include a connector 2006 including a plurality of pins that are provided to have connection with an external host. The number and/or the arrangement of the plurality of pins on the connector 2006 are not limited thereto, and for example may be based on or changed based on a communication interface between the electronic system 2000 and the external host. The electronic system 2000 may communicate with the external host through one or more interfaces, for example, through one or more of universal serial bus (USB), peripheral component interconnect express (PIC-Express), serial advanced technology attachment (SATA), and M-PHY for universal flash storage (UFS). For example, the electronic system 2000 may operate with power that is supplied through the connector 2006 from the external host. The electronic system 2000 may further include a power management integrated circuit (PMIC) by which the power supplied from the external host is distributed to the controller 2002 and the semiconductor package 2003.

The controller 2002 may write data to the semiconductor package 2003 and/or may read data from the semiconductor package 2003, and/or may increase an operating speed of the electronic system 2000.

The DRAM 2004 may be or may include a buffer memory that reduces a difference in speed between the external host and the semiconductor package 2003 that serves as a data storage space. The DRAM 2004 included in the electronic system 2000 may operate as a cache, e.g. as a kind of cache memory, and may provide a space for temporary data storage in a control operation of the semiconductor package 2003. When the DRAM 2004 is included in the electronic system 2000, the controller 2002 may include not only a NAND controller for controlling the semiconductor package 2003, but also a DRAM controller for controlling the DRAM 2004. The NAND controller and the DRAM controller may be separate controllers, or may be integrated controllers.

The semiconductor package 2003 may include first and second semiconductor packages 2003a and 2003b that are spaced apart from each other. Each of the first and second semiconductor packages 2003a and 2003b may include a plurality of semiconductor chips 2200. Each of the first and second semiconductor package 2003a and 2003b may include a package substrate 2100, semiconductor chips 2200 on the package substrate 2100, adhesion layers 2300 on bottom surfaces of the semiconductor chips 2200, connection structures 2400 that electrically connect the semiconductor chips 2200 to the package substrate 2100, and a molding layer 2500 that lies on the package substrate 2100 and covers the semiconductor chips 2200 and the connection structures 2400.

The package substrate 2100 may be or may include an integrated circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stack structures 3210 and vertical channel structures 3220. Each of the semiconductor chips 2200 may include a three-dimensional semiconductor memory device which will be discussed below.

For example, the connection structures 2400 may be or may include bonding wires that electrically connect the input/output pads 2210 to the package upper pads 2130. On each of the first and second semiconductor packages 2003a and 2003b, the semiconductor chips 2200 may be electrically connected to each other in a wire bonding manner, and may be electrically connected to the package upper pads 2130 of the package substrate 2100. In some example embodiments, on each of the first and second semiconductor packages 2003a and 2003b, the semiconductor chips 2200 may be electrically connected to each other using through-silicon vias (TSVs) instead of or in addition to the connection structures 2400 or the bonding wires.

For example, the controller 2002 and the semiconductor chips 2200 may be included in a single package. For example, the controller 2002 and the semiconductor chips 2200 may be mounted on a separate interposer substrate other than the main board 2001, and may be connected to each other through lines provided in the interposer substrate.

Figure 3:
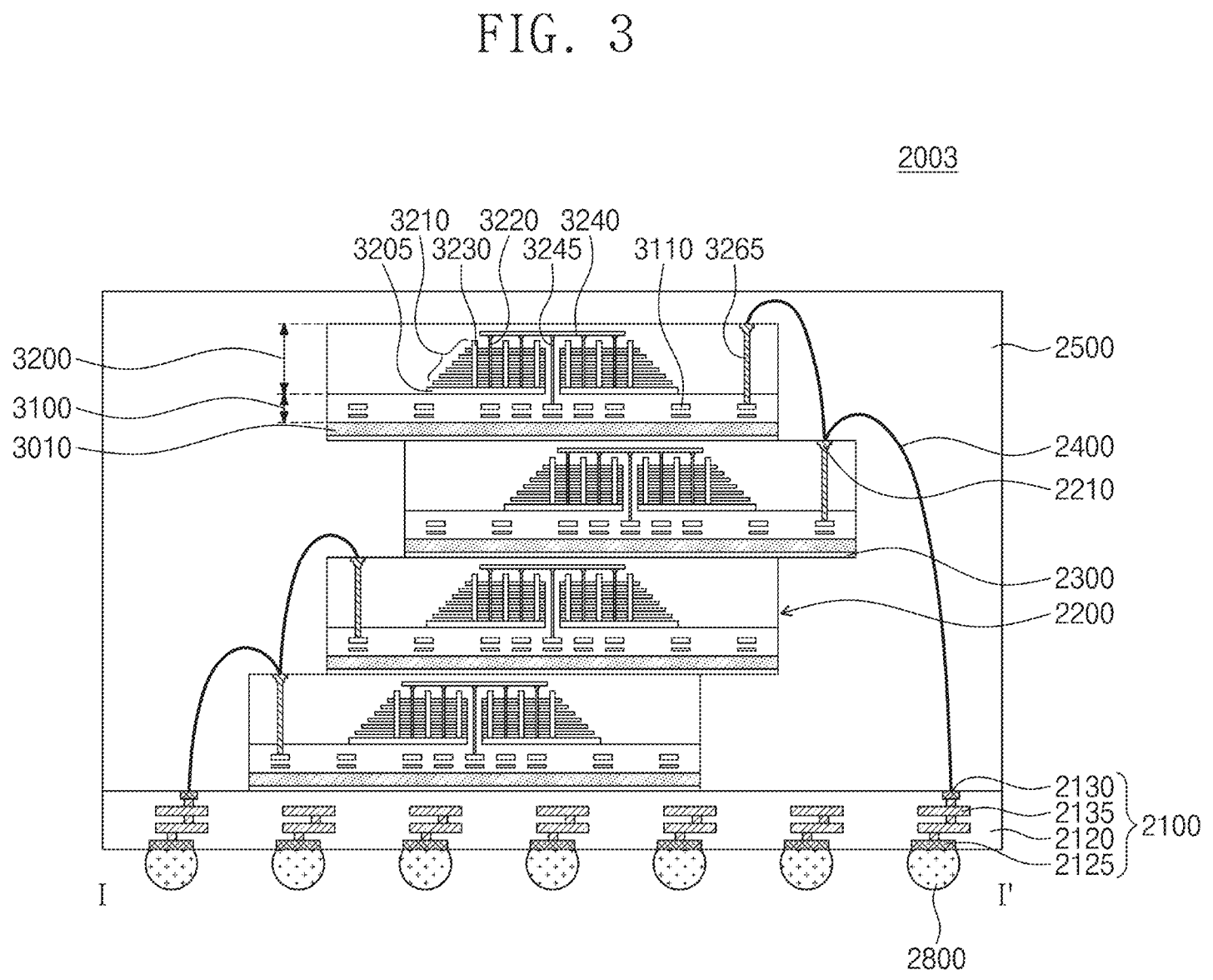
Figure 4:
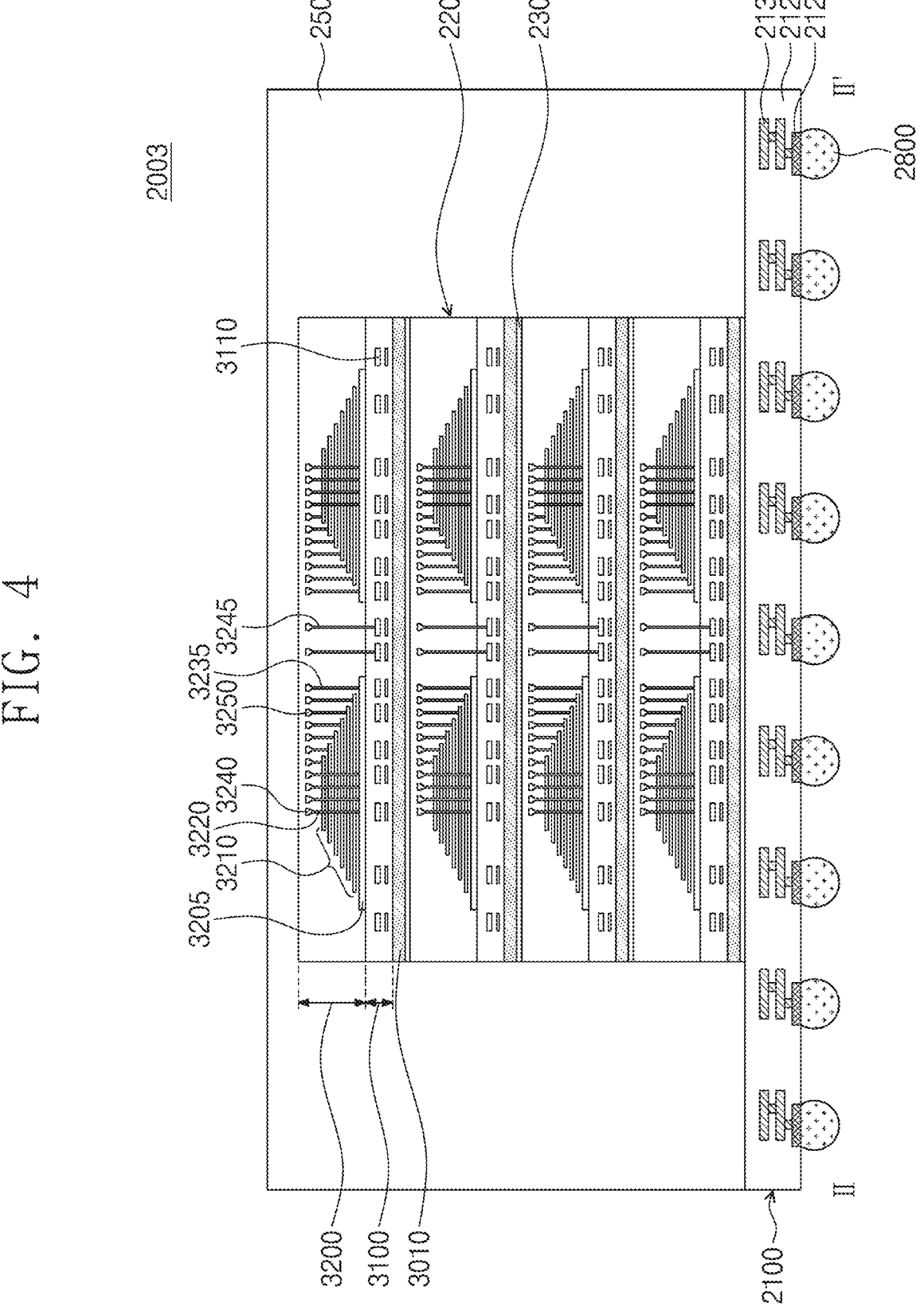

FIGS. 3 and 4 illustrate cross-sectional views respectively taken along lines I-I' and II-II' of FIG. 2, showing a semiconductor package that includes a three-dimensional semiconductor memory device according to various example embodiments.

Referring to FIGS. 3 and 4, a semiconductor package 2003 may include a package substrate 2100, a plurality of semiconductor chips on the package substrate 2100, and a molding layer 2500 that covers the package substrate 2100 and the plurality of semiconductor chips.

The package substrate 2100 may include a package substrate body 2120, package upper pads 2130 disposed on a top surface of the package substrate body 2120, package lower pads 2125 disposed or exposed on a bottom surface of the package substrate body 2120, and internal wiring lines 2135 that lie in the package substrate body 2120 and electrically connect the package upper pads 2130 to the package lower pads 2125. The package upper pads 2130 may be electrically connected to connection structures 2400. The package lower pads 2125 may be connected through conductive connectors 2800 to the wiring patterns 2005 in the main board 2001 of the electronic system 2010 depicted in FIG. 2.

Each of, or at least some of, the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral wiring lines 3110. The second structure 3200 may include a common source line 3205, a gate stack structure 3210 on the common source line 3205, vertical channel structures 320 and separation structures 3230 that penetrate the gate stack structure 3210, bit lines 3240 electrically connected to the vertical channel structures 3220, and gate connection lines 3235 and conductive lines 3250 that are electrically connected the word lines (see WL of FIG. 1) of the gate stack structure 3210. A number and/or a size of, and/or a geometry of each of the first structures 3100 and the second structures 3200 that are included in different ones of the semiconductor chips 2200 may be the same as, or different from, each other.

Each of, or at least some of, the semiconductor chips 2200 may include one or more (e.g. the same or a different number of) through wiring lines 3245 that extend into the second structure 3200 and are electrically connected to the peripheral wiring lines 3110 of the first structure 3100. The through wiring line 3245 may penetrate the gate stack structure 3210, and may further be disposed outside the gate stack structure 3210. Each of the semiconductor chips 2200 may further independently include one or more of an input/output connection line 3265 that has an electrical connection with the peripheral wiring line 3110 of the first structure 3100 and extends into the second structure 3200, and may also further include an input/output pad 2210 electrically connected to the input/output connection line 3265.

Figure 5:
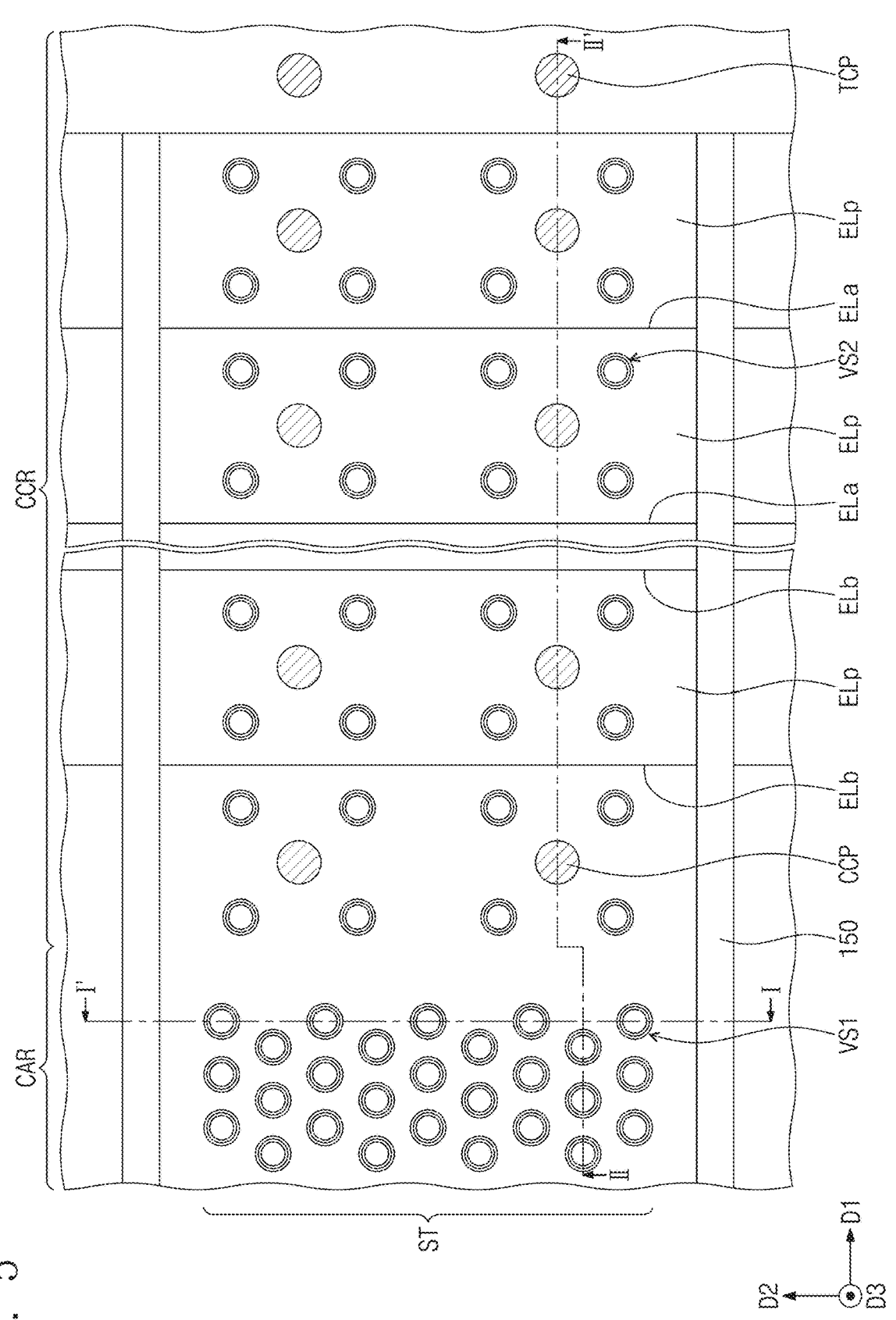
FIG. 5 illustrates a plan view showing a three-dimensional semiconductor memory device according to various example embodiments.
Figure 6A:
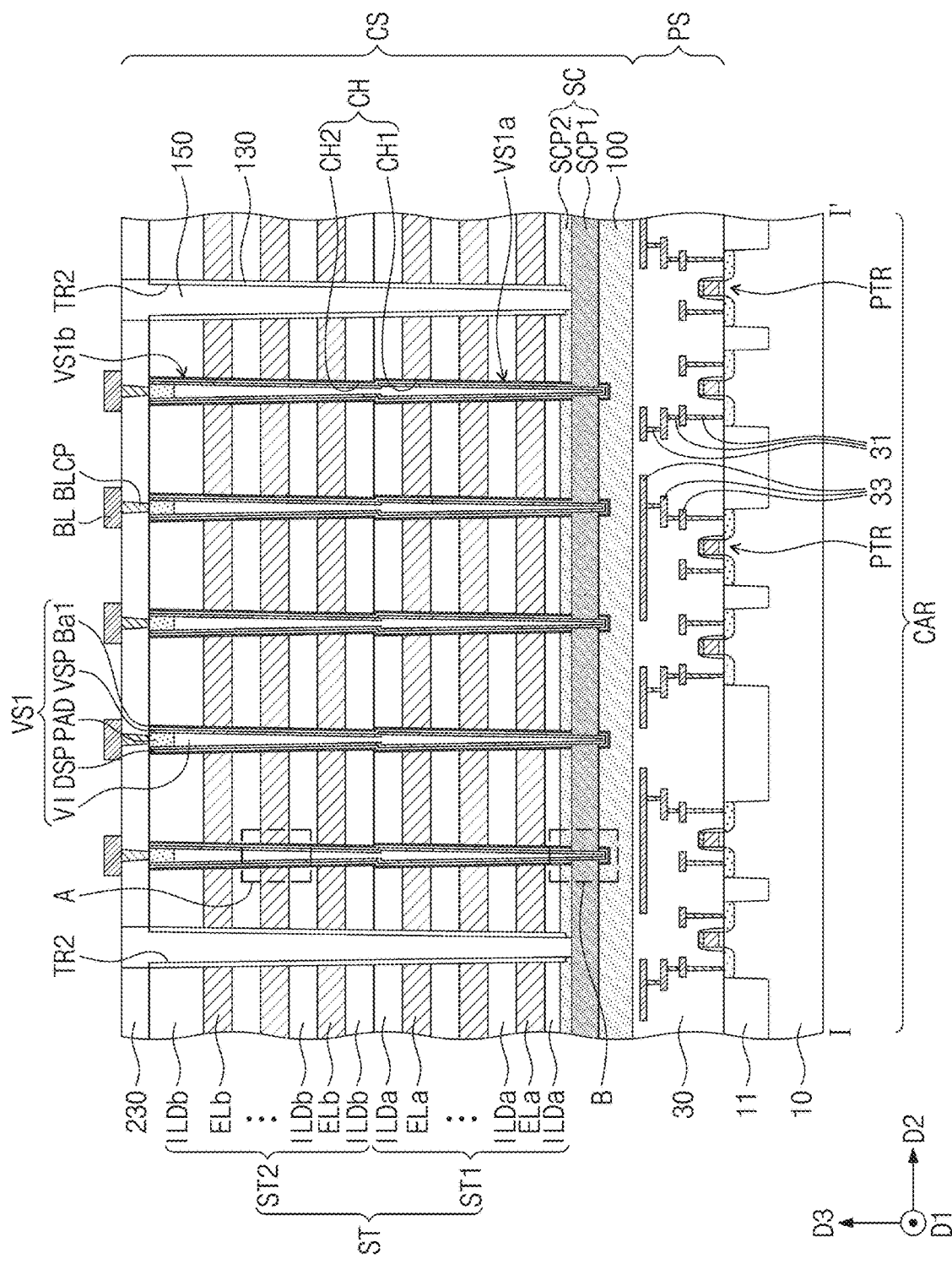
FIGS. 6A and 6B illustrate cross-sectional views respectively taken along lines I-I' and II-II' of FIG. 5, showing a three-dimensional semiconductor memory device according to various example embodiments.
Figure 6B:
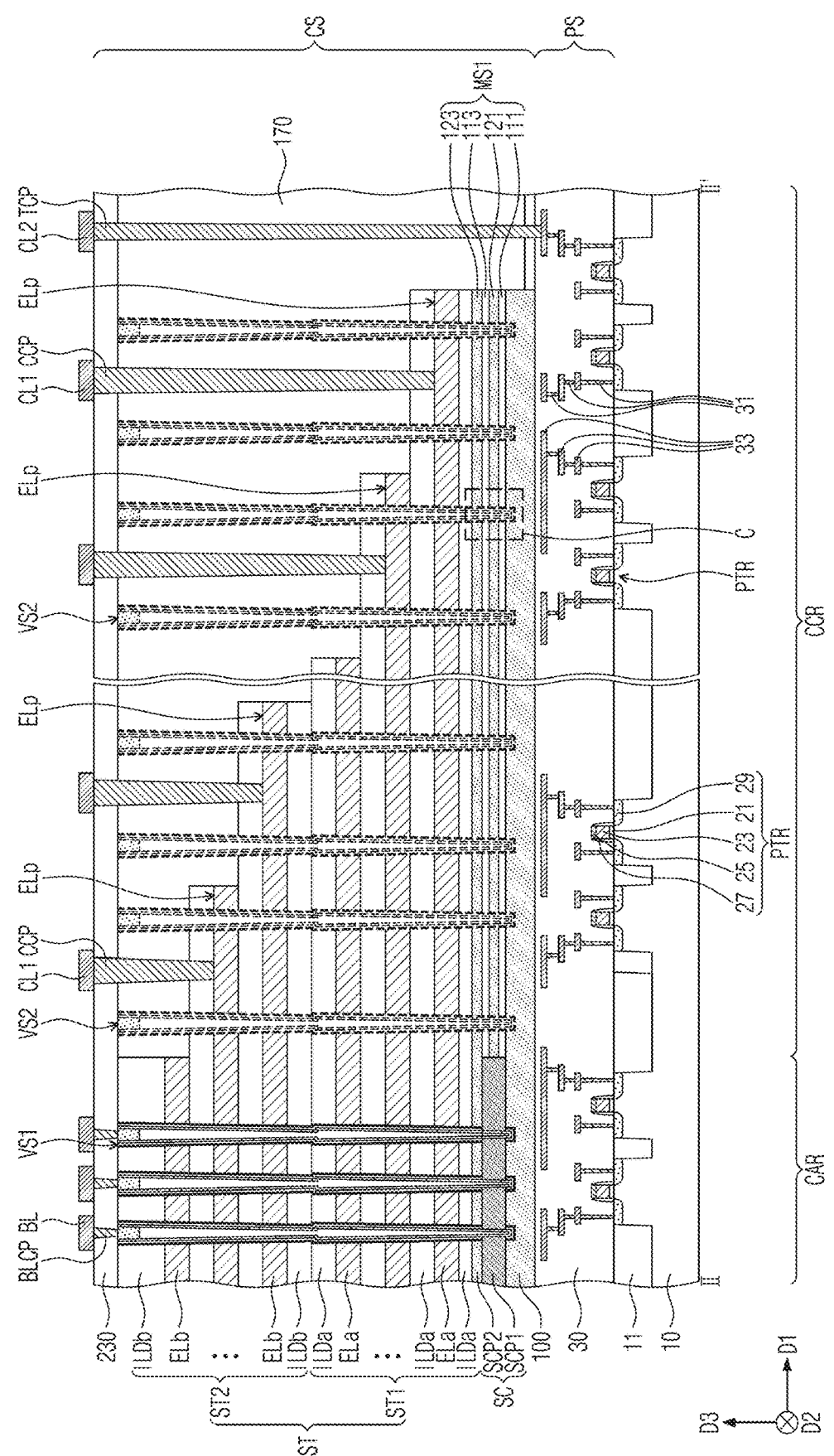

FIG. 5 illustrates a plan view showing a three-dimensional semiconductor memory device according to various example embodiments. FIGS. 6A and 6B illustrate cross-sectional views respectively taken along lines I-I' and II-II' of FIG. 5, showing a three-dimensional semiconductor memory device according to various example embodiments.

Referring to FIGS. 5, 6A, and 6B, a three-dimensional semiconductor memory device according to various example embodiments may include a first substrate 10, a peripheral circuit structure PS on the first substrate 10, and a cell array structure CS on the peripheral circuit structure PS. The first substrate 10, the peripheral circuit structure PS, and the cell array structure CS may respectively correspond to the semiconductor substrate 3010, the first structure 3100 on the semiconductor substrate 3010, and the second structure 3200 on the first structure 3100 of FIG. 3 or 4.

The first substrate 10 may be provided which includes a cell array region CAR and a contact region CCR. The first substrate 10 may extend in a first direction D1 directed from the cell array region CAR toward the contact region CCR and in a second direction D2 that intersects the first direction D1. The first substrate 10 may have a top surface perpendicular to a third direction D3 that intersects the first and second directions D1 and D2. For example, the first, second, and third directions D1, D2, and D3 may be orthogonal to each other.

When viewed in plan, the contact region CCR may extend in the first direction D1 (or a direction opposite to the first direction D1) from the cell array region CAR. The cell array region CAR may be or may correspond to an area on which are provided the vertical channel structure 3220, the separation structures 3230, and the bit lines 3240 electrically connected to the vertical channel structures 3230, which components 3220, 3230, and 3240 are discussed with reference to FIG. 3 or 4. The contact region CCR may be or may correspond to an area on which is provided a stepwise structure including pad parts ELp which will be discussed below. Differently from that shown, the contact region CCR may extend in the second direction D2 (or a direction opposite to the second direction D2) from the cell array region CAR.

The first substrate 10 may be or may include, for example, a silicon substrate, a silicon-germanium substrate, a germanium substrate, or a monocrystalline epitaxial layer grown on a monocrystalline silicon substrate. The first substrate 10 may be doped, e.g., may be lightly doped with boron impurities; however, example embodiments are not limited thereto. A device isolation layer 11 may be provided in the first substrate 10. The device isolation layer 11 may define an active section of the first substrate 10. The device isolation layer 11 may include, for example, silicon oxide.

The peripheral circuit structure PS may be provided on the first substrate 10. The peripheral circuit structure PS may include peripheral circuit transistors PTR on the active section of the first substrate 10, peripheral contact plugs 31, peripheral circuit lines 33 electrically connected through the peripheral contact plugs 31 to the peripheral circuit transistors PTR, and a first dielectric layer 30 that surrounds the peripheral circuit transistors PTR, the peripheral contact plugs 31, and the peripheral circuit lines 33. The peripheral circuit structure PS may correspond to the first region 1100F of FIG. 1, and the peripheral circuit lines 33 may correspond to the peripheral wiring lines 3110 of FIG. 3 or 4. The peripheral circuit transistors PTR may be planar transistors; alternatively or additionally, at least one, some, or all of the peripheral circuit transistors PTR may be non-planar (such as three-dimensional) transistors.

A peripheral circuit may be constituted by or may correspond to the peripheral circuit transistors PTR, the peripheral contact plugs 31, and the peripheral circuit lines 33. For example, the peripheral circuit transistors PTR may constitute or be included in the decoder circuit 1110, the page buffer 1120, and the logic circuit 1130 of FIG. 1. In more detail, each of the peripheral circuit transistors PTR may include a peripheral gate dielectric layer 21, a peripheral gate electrode 23, a peripheral capping pattern 25, a peripheral gate spacer 27, and peripheral source/drain sections 29.

The peripheral gate dielectric layer 21 may be provided between the peripheral gate electrode 23 and the first substrate 10. The peripheral capping pattern 25 may be provided on the peripheral gate electrode 23. The peripheral gate spacer 27 may cover or at least partially cover a sidewall of the peripheral gate dielectric layer 21, a sidewall of the peripheral gate electrode 23, a sidewall and of the peripheral capping pattern 25. The peripheral source/drain sections 29 may be provided in the first substrate 10 adjacent to opposite sides of the peripheral gate electrode 23.

The peripheral circuit lines 33 may be electrically connected through the peripheral contact plugs 31 to the peripheral circuit transistors PTR. Each of or at least some of the peripheral circuit transistors PTR may be, for example, an NMOS transistor, a PMOS transistor. Each of, or at least some of, the, peripheral circuit transistors PTR may be a gate-all-around type transistor. For example, the peripheral contact plugs 31 may each have a width in the first direction D1 or the second direction D2 that increases with increasing distance from the first substrate 10. The peripheral contact plugs 31 and the peripheral circuit lines 33 may include a conductive material, such as a metal such as one or more of tungsten, titanium, aluminum, or copper.

The first dielectric layer 30 may be disposed on the top surface of first substrate 10. On the first substrate 10, the first dielectric layer 30 may cover the peripheral circuit transistors PTR, the peripheral contact plugs 31, and the peripheral circuit lines 33. The first dielectric layer 30 may include a plurality of dielectric layers that constitute a multi-layered structure. For example, the first dielectric layer 30 may include one or more of silicon oxide, silicon nitride, silicon oxynitride, and low-k dielectrics.

The first dielectric layer 30 may be provided thereon with the cell array structure CS including a second substrate 100 and a stack structure ST on the second substrate 100. The second substrate 100 may extend in the first and second directions D1 and D2. The second substrate 100 may not be provided on a partial area of the contact region CCR. The second substrate 100 may be or may include a semiconductor substrate including a semiconductor material. The second substrate 100 may include, for example, at least one selected from silicon (Si), germanium (Ge), silicon germanium (SiGe), gallium arsenic (GaAs), indium-gallium-arsenic (InGaAs), aluminum-gallium-arsenic (AlGaAs), and a mixture thereof. The second substrate 100 may be composed of the same, or different, materials from the first substrate 10.

The stack structure ST may be provided on the second substrate 100. The stack structure S T may extend from the cell array region CAR toward the contact region CCR. The stack structure ST may correspond to the stack structure 3210 of FIG. 3 or 4. The stack ST may be provided in plural, and the plurality of stack structures ST may be arranged along the second direction D2 and spaced apart in the second direction D2 from each other across a separation structure 150 which will be discussed below. For convenience of description, the following explanation will focus on a single stack structure ST, but example embodiments may also be applicable to other stack structures ST.

The stack structure ST may include interlayer dielectric layers ILDa and ILDb and gate electrodes ELa and ELb that are alternately stacked. The gate electrodes ELa and ELb may correspond to the word lines WL, the first lines LL1 and LL2, and the second lines UL1 and UL2 of FIG. 1.

The stack structure ST may include, for example, a first stack structure ST1 on the second substrate 100 and a second stack structure ST2 on the first stack structure ST1. The first stack structure ST1 may include first interlayer dielectric layers ILDa and first gate electrodes ELa that are alternately stacked, and the second stack structure ST2 may include second interlayer dielectric layers ILDb and second gate electrodes ELb that are alternately stacked. The first and second gate electrodes ELa and ELb may have substantially the same thickness in the third direction D3. In this description below, the term "thickness" may indicate a thickness in the third direction D3. A number of the first gate electrodes ELa may be the same as, or different from, a number of second gate electrodes ELb.

The first and second gate electrodes ELa and ELb may have their lengths in the first direction D1 that decrease with increasing distance (or in the third direction D3) from the second substrate 100. For example, each of the first and second gate electrodes ELa and ELb may have a length in the first direction D1 that is not less than, e.g. is the same as or greater than a length in the first direction D1 of an immediately overlying gate electrode. A lowermost one of the first gate electrodes ELa included in the first stack structure ST1 may have a maximum length in the first direction D1, and an uppermost one of the second gate electrodes ELb included in the second stack structure ST2 may have a minimum length in the first direction D1.

The first and second gate electrodes ELa and ELb may have their pad parts ELp on the contact region CCR. The pad parts ELp of the first and second gate electrodes ELa and ELb may be disposed at their positions that are horizontally and vertically different from each other. The pad parts ELp may constitute or correspond to a stepwise structure/staircase structure along the first direction D1.

The stepwise structure may be arranged such that each of the first and second stack structures ST1 and ST2 may have a thickness which decreases with increasing distance from an outermost one of first vertical channel structures VS1 which will be discussed below, and such that the first and second gate electrodes ELa and ELb may have their sidewalls spaced apart from each other along the first direction D1 at a regular interval when viewed in plan.

The first and second electrodes ELa and ELb may include, for example, at least one selected from doped semiconductors (e.g., doped silicon, etc.), metals (e.g., tungsten, copper, aluminum, etc.), conductive metal nitrides (e.g., titanium nitride, tantalum nitride, etc.), and transition metals (e.g., titanium, tantalum, etc.). For example, the first and second gate electrodes ELa and ELb may include tungsten.

The first and second interlayer dielectric layers ILDa and ILDb may be provided between the first and second gate electrodes ELa and ELb, and may each have a sidewall aligned with that of an underlying one of the first and second gate electrodes ELa and ELb. For example, likewise the first and second gate electrodes ELa and ELb, the first and second interlayer dielectric layers ILDa and ILDb may have their lengths in the first direction D1 that decrease with increasing distance from the second substrate 100.

A lowermost one of the second interlayer dielectric layers ILDb may be in contact with an uppermost one of the first interlayer dielectric layers ILDa. For example, each of the first and second interlayer dielectric layers ILDa and ILDb may have a thickness less than that of each of the first and second gate electrodes ELa and ELb. For example, a lowermost one of the first interlayer dielectric layers ILDa may have a thickness less than that of each of other interlayer dielectric layers ILDa and ILDb. For example, an uppermost one of the second interlayer dielectric layers ILDb may have a thickness greater than that of each of other interlayer dielectric layers ILDa and ILDb.

Except the lowermost first interlayer dielectric layer ILDa and the uppermost second interlayer dielectric layer ILDb, other interlayer dielectric layers ILDa and ILDb may have substantially the same thickness. This, however, is merely an example, and the first and second interlayer dielectric layers ILDa and ILDb may have their thicknesses different from one another; for example, thicknesses that are based on or changed based on properties of a semiconductor device.

The first and second interlayer dielectric layers ILDa and ILDb may include, for example, one or more of silicon oxide, silicon nitride, silicon oxynitride, and low-k dielectrics. For example, the first and second interlayer dielectric layers ILDa and ILDb may include high-density plasma (HDP) oxide and/or tetraethylorthosilicate (TEOS).

A source structure SC may be provided between the lowermost first interlayer dielectric layer ILDa and the second substrate 100 on the cell array region CAR. The source structure SC may correspond to the common source line CSL of FIG. 1 or the common source line 3205 of FIG. 3 or 4. The source structure SC may include a first source conductive pattern SCP1 and a second source conductive pattern SCP2 that are sequentially stacked on the second substrate 100. The second source conductive pattern SCP2 may be provided between the first source conductive pattern SCP1 and the lowermost first interlayer dielectric layer ILDa. The first source conductive pattern SCP1 may have a thickness greater than that of the second source conductive pattern SCP2.

The first and second source conductive patterns SCP1 and SCP2 may include a semiconductor material such as silicon or a semiconductor material doped with impurities. For example, when the first and second source conductive patterns SCP1 and SCP2 include a semiconductor material doped with impurities, the first source conductive pattern SCP1 may have an impurity concentration greater than (e.g. greater by at least one order of magnitude than) that of the second source conductive pattern SCP2.

The first source conductive pattern SCP1 of the source structure SC may be provided on the cell array region CAR, but not on the contact region CCR. The second source conductive pattern SCP2 of the source structure SC may extend from the cell array region CAR to the contact region CCR. The second source conductive pattern SCP2 on the contact region CCR may be called a second semiconductor layer 123 which will be discussed below.

A first mold structure MS1 may be provided between the lowermost first interlayer dielectric layer ILDa and the second substrate 100 on the contact region CCR. The first mold structure MS1 may include a first buffer dielectric layer 111, a first semiconductor layer 121, a second buffer dielectric layer 113, and a second semiconductor layer 123 that are sequentially stacked on the second substrate 100.

The first semiconductor layer 121 may be provided between the second substrate 100 and the second semiconductor layer 123. The first buffer dielectric layer 111 may be provided between the second substrate 100 and the first semiconductor layer 121, and the second buffer dielectric layer 113 may be provided between the first semiconductor layer 121 and the second semiconductor layer 123. The first buffer dielectric layer 111 may have a bottom surface substantially coplanar with that of the first source conductive pattern SCP1. The second buffer dielectric layer 113 may have a top surface substantially coplanar with that of the first source conductive pattern SCP1.

The first and second buffer dielectric layers 111 and 113 may include, for example, silicon oxide, and may include the same or different materials. The first and second semiconductor layers 121 and 123 may include a material having an etch selectivity with respect to a first barrier pattern Bat which will be discussed below. The first and second semiconductor layers 121 and 123 may include a semiconductor material, such as silicon, and may include the same or different materials.

On the cell array region CAR, a plurality of first vertical channel structures VS1 may be provided to penetrate the stack structure ST and the source structure SC. The first vertical channel structures VS1 may penetrate at least a portion of the second substrate 100, and each of the first vertical channel structures VS1 may have a bottom surface located at a level lower than that of a top surface of the second substrate 100 and that of a bottom surface of the source structure SC. For example, the first vertical channel structures VS1 may be in contact with or in direct contact with the second substrate 100. A portion of each of the first vertical channel structures VS1 may be inserted into the second substrate 100.

When viewed in plan as shown in FIG. 5, the first vertical channel structures VS1 may be arranged in a zigzag fashion along the first direction D1 or the second direction D2. The first vertical channel structures VS1 may not be provided on the contact region CCR. The first vertical channel structures VS1 may correspond to the vertical channel structures 3220 of FIGS. 2 to 4. The first vertical channel structures VS1 may correspond to channels of the first transistors LT1 and LT2, channels of the memory cell transistors MCT, and channels of the second transistors UT1 and UT2 of FIG. 1.

The first vertical channel structures VS1 may be provided in vertical channel holes CH that penetrate the stack structure ST. Each of the vertical channel holes CH may include a first vertical channel hole CH1 that penetrates the first stack structure ST1 and a second vertical channel hole CH2 that penetrates the second stack structure ST2. The first and second vertical channel holes CH1 and CH2 of each of the vertical channel holes CH may be connected to each other or contiguous with each other in the third direction D3.

Each of the first vertical channel structures VS1 may include a first part VS1a and a second part VS1b. The first part VS1a may be provided in the first vertical channel hole CH1, and the second part VS1b may be provided in the second vertical channel hole CH2. The second part VS1b may be provided on and connected to the first part VS1a.

Each of the first and second parts VS1a and VS1b may have a tapered profile. For example, each of the first and second parts VS1a and VS1b may have a width in the first direction D1 and/or the second direction D2 that increases in the third direction D3. A width at a top side of the first part VS1a may be greater than that at a bottom side of the second part VS1b. For example, each of the first vertical channel structures VS1 may have a sidewall that has a step difference at a boundary between the first part VS1a and the second part VS1b.

This, however, is merely an example, and the present inventive concepts are not limited thereto. For example, each of the first vertical channel structures VS1 may have a sidewall that has three or more step differences at different levels or that is flat with no step difference.

Each of the first vertical channel structures VS1 may include a first barrier pattern Ba1, a data storage pattern DSP, a vertical semiconductor pattern VSP, a buried dielectric pattern VI that fills an internal space surrounded by the vertical semiconductor pattern VSP, and a conductive pad PAD on the buried dielectric pattern VI that are sequentially provided on an inner sidewall of each of the vertical channel holes CH.

The conductive pad PAD may be provided in a space surrounded by the buried dielectric pattern VI and the data storage pattern DSP (or the vertical semiconductor pattern VSP). A top surface of each of the first vertical channel structures VS1 may have, for example, a circular shape, an oval shape, or a bar shape. The first barrier pattern Ba1 may be adjacent to the stack structure ST to cover the sidewalls of the first and second interlayer dielectric layers ILDa and ILDb and the sidewalls of the first and second gate electrodes ELa and ELb. The data storage pattern DSP may conformally cover an inner sidewall of the first barrier pattern Ba1. The vertical semiconductor pattern VSP may conformally cover an inner sidewall of the data storage pattern DSP.

The data storage pattern DSP may be provided between the first barrier pattern Ba1 and the vertical semiconductor pattern VSP. The vertical semiconductor pattern VSP may be provided between the data storage pattern DSP and the buried dielectric pattern VI. The vertical semiconductor pattern VSP may have a macaroni shape and/or a pipe shape whose bottom end is closed. The first barrier pattern Ba1 and the data storage pattern DSP may each have a macaroni shape or a pipe shape whose bottom end is opened.

The first barrier pattern Ba1 may include a high-k dielectric material whose dielectric constant is greater than that of the silicon oxide and that of silicon nitride. For example, the first barrier pattern Bat may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate. The first barrier pattern Ba1 may include, for example, aluminum oxide and/or hafnium oxide.

The vertical semiconductor pattern VSP may include, for example, one or more of an impurity-doped semiconductor material, an impurity-undoped intrinsic semiconductor material, or a polycrystalline semiconductor material. As discussed below with reference to FIG. 7B, the vertical semiconductor pattern VSP may be in contact with a portion of the source structure SC. The conductive pad PAD may include, for example, an impurity-doped semiconductor material and/or a conductive material.

On the contact region CCR, a plurality of second vertical channel structures VS2 may be provided to penetrate a subsequently described second dielectric layer 170, the stack structure ST, and the first mold structure MS1. For example, the second vertical channel structures VS2 may penetrate the pad parts ELp of the first and second gate electrodes ELa and ELb. A portion of each of the second vertical channel structures VS2 may be inserted into the second substrate 100. The second vertical channel structures VS2 may be provided around cell contact plugs CCP which will be discussed below. The second vertical channel structures VS2 may not be provided on the cell array region CAR. The second vertical channel structures VS2 may be formed after (e.g. immediately after) and/or simultaneously with the first vertical channel structures VS1 and may have substantially the same configuration as that of the first vertical channel structures VS1. However, the second vertical channel structures VS2 may not be provided in accordance with some embodiments.

On the contact region CCR, a second dielectric layer 170 may be provided to cover the stack structure ST and a portion of the first dielectric layer 30. For example, the second dielectric layer 170 may cover the stepwise structure of the stack structure ST, and may be provided on the pad parts ELp of the first and second gate electrodes ELa and ELb. The second dielectric layer 170 may have a top surface that is substantially flat. The top surface of the second dielectric layer 170 may be substantially coplanar with an uppermost surface of the stack structure ST. For example, the top surface of the second dielectric layer 170 may be substantially coplanar with that of the uppermost second interlayer dielectric layer ILDb of the stack structure ST.

The second dielectric layer 170 may include a single dielectric layer or a plurality of stacked dielectric layers. The second dielectric layer 170 may include a dielectric material, for example, one or more of silicon oxide, silicon nitride, silicon oxynitride, and low-k dielectrics. The second dielectric layer 170 may include a dielectric material different from that of the first and second interlayer dielectric layers ILDa and ILDb of the stack structure ST. For example, when the first and second interlayer dielectric layers ILDa and ILDb of the stack structure ST include high-density plasma oxide, the second dielectric layer 170 may include tetraethylorthosilicate (TEOS).

A third dielectric layer 230 may be provided on the second dielectric layer 170 and the stack structure ST. The third dielectric layer 230 may cover the top surface of the second dielectric layer 170, the top surface of the uppermost second interlayer dielectric layer ILDb of the stack structure ST, and the top surfaces of the first and second vertical channel structures VS1 and VS2.

The third dielectric layer 230 may include a single dielectric layer or a plurality of stacked dielectric layers. The third dielectric layer 230 may include, for example, one or more of silicon oxide, silicon nitride, silicon oxynitride, and low-k dielectrics. For example, the third dielectric layer 230 may include a dielectric material substantially the same as that of the second dielectric layer 170 and different from that of the first and second interlayer dielectric layers ILDa and ILDb of the stack structure ST.

Bit-line contact plugs BLCP may be provided which penetrate the third dielectric layer 230 to come into connection with the first vertical channel structures VS1. Cell contact plugs CCP may be provided which penetrate the third and second dielectric layers 230 and 170 to come into connection with the first and second gate electrodes ELa and ELb.

Each of the cell contact plugs CCP may penetrate one of the first and second interlayer dielectric layers ILDa and ILDb to come into direct contact with one of the pad parts ELp of the first and second gate electrodes ELa and ELb. The cell contact plugs CCP may be adjacent to and spaced apart from the plurality of second vertical channel structures VS2. The cell contact plugs CCP may correspond to the gate connection lines 3235 of FIG. 4.

A peripheral contact plug TCP may be provided to penetrate the third dielectric layer 230, the second dielectric layer 170, and at least a portion of the first dielectric layer 30 to come into electrical connection with the peripheral circuit transistor PTR of the peripheral circuit structure PS. Differently from that shown, the peripheral contact plug TCP may be provided in plural. The peripheral contact plug TCP may be spaced apart in the first direction D1 from the second substrate 100, the source structure SC, and the stack structure ST. The peripheral contact plug TCP may correspond to the through wiring line 3245 of FIG. 3 or 4.

For example, the bit-line contact plugs BLCP, the cell contact plugs CCP, and the peripheral contact plug TCP may each have a width in the first direction D1 or the second direction D2 that increases in the third direction D3.

The third dielectric layer 230 may be provided thereon with bit lines BL that correspond to the bit-line contact plugs BLCP. The bit line BL may correspond to the bit line BL of FIG. 1 and/or the bit line 3240 of FIG. 3 or 4.

The third dielectric layer 230 may be provided thereon with first conductive lines CL1 connected to the cell contact plugs CCP and with a second conductive line CL2 connected to the peripheral contact plug TCP. The first and second conductive lines CL1 and CL2 may correspond to the conductive lines 3250 of FIG. 4.

The bit-line contact plugs BLCP, the cell contact plugs CCP, the peripheral contact plug TCP, the bit lines BL, and the first and second conductive lines CL1 and CL2 may include a conductive material, such as metal. Although not shown, the third dielectric layer 230 may be provided thereon with additional wiring lines and additional vias that are electrically connected to the bit lines BL and the first and second conductive lines CL1 and CL2.

When the stack structure ST is provided in plural, a separation structure 150 may be provided in a second trench TR2 that runs across in the first direction D1 between the plurality of stack structures ST. The separation structure 150 may be spaced apart in the second direction D2 from the first and second vertical channel structures VS1 and VS2.

For example, the separation structure 150 may have a top surface located at a level higher than that of the top surfaces of the first and second vertical channel structures VS1 and VS2. For example, the separation structure 150 may have a bottom surface which is substantially coplanar with the top surface of the first source conductive pattern SCP1 and which is located at a level higher than that of the top surface of the second substrate 100.

The separation structure 150 may be provided in plural, and the plurality of separation structures 150 may be spaced apart in the second direction D2 from each other across the stack structure ST. The separation structure 150 may correspond to the separation structure 3230 of FIG. 3 or 4.

The separation structure 150 and the stack structure ST may be provided therebetween with a separation spacer 130 that surrounds the separation structure 150. The separation spacer 130 may conformally cover the sidewalls of the first and second interlayer dielectric layers ILDa and ILDb and the sidewalls of the first and second gate electrodes ELa and ELb. The separation layer 150 may include, for example, silicon oxide and may or may not include silicon nitride. The separation spacer 130 may include a material having an etch selectivity with respect to (e.g. may etch slower than in the presence of an etchant such as a wet and/or dry etchant) the second source conductive pattern SCP2 and the first and second semiconductor layers 121 and 123. The separation spacer 130 may include, for example, silicon nitride and may or may not include silicon oxide.

Figure 7A:
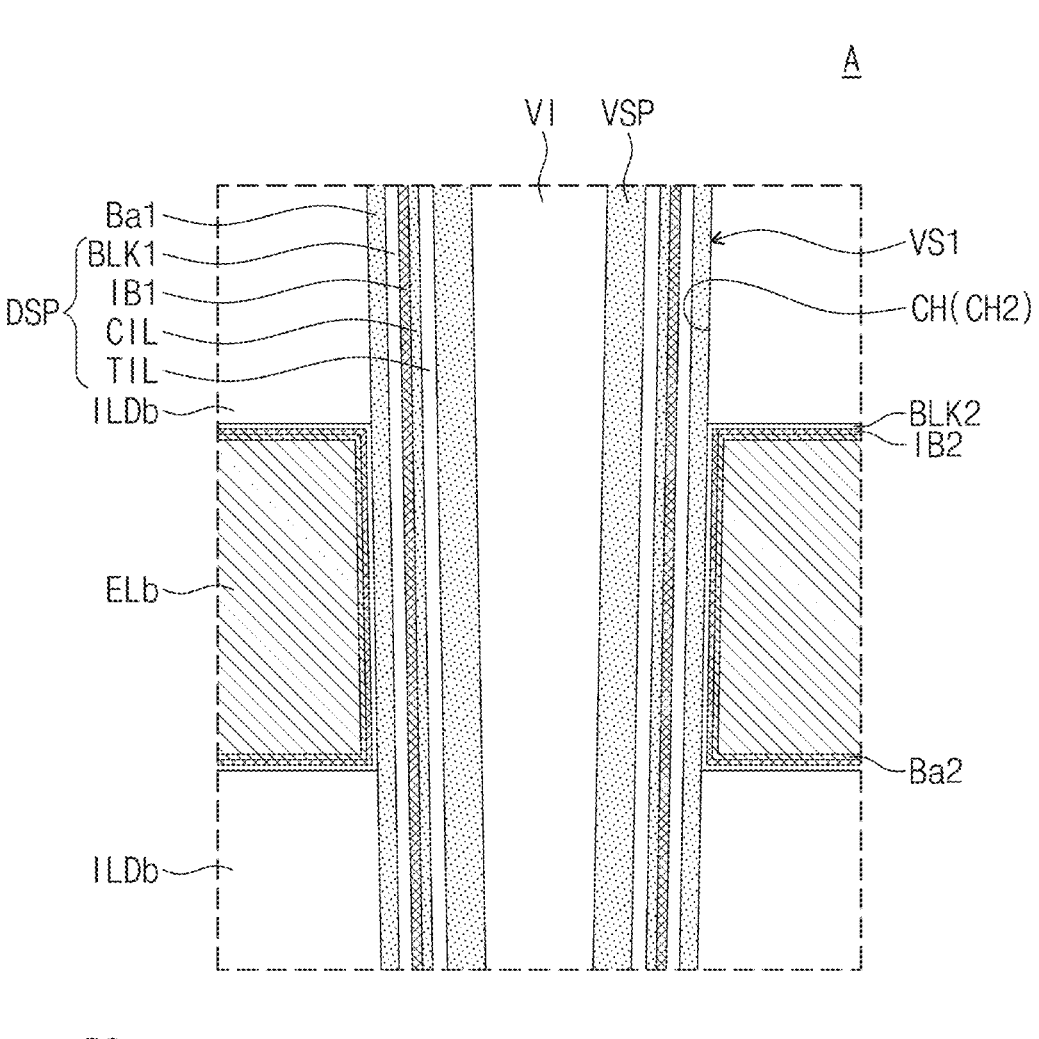
FIG. 7A illustrates an enlarged view of section A depicted in FIG. 6A, partially showing a three-dimensional semiconductor memory device according to various example embodiments.
Figure 7A:
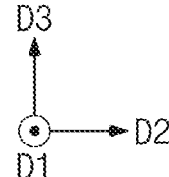
Figure 7B:
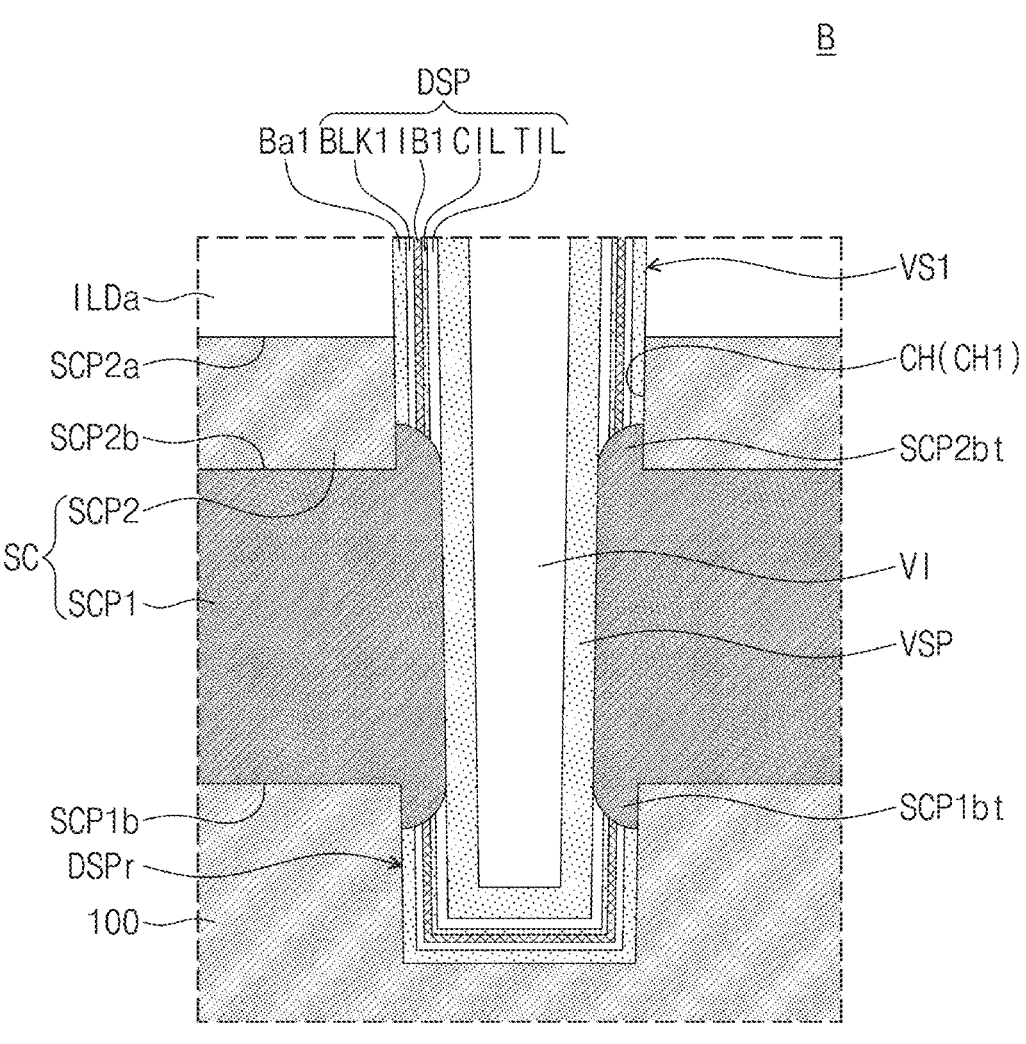
FIG. 7B illustrates an enlarged view of section B depicted in FIG. 6A, partially showing a three-dimensional semiconductor memory device according to various example embodiments.
Figure 7B:
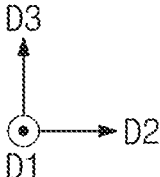
Figure 7C:
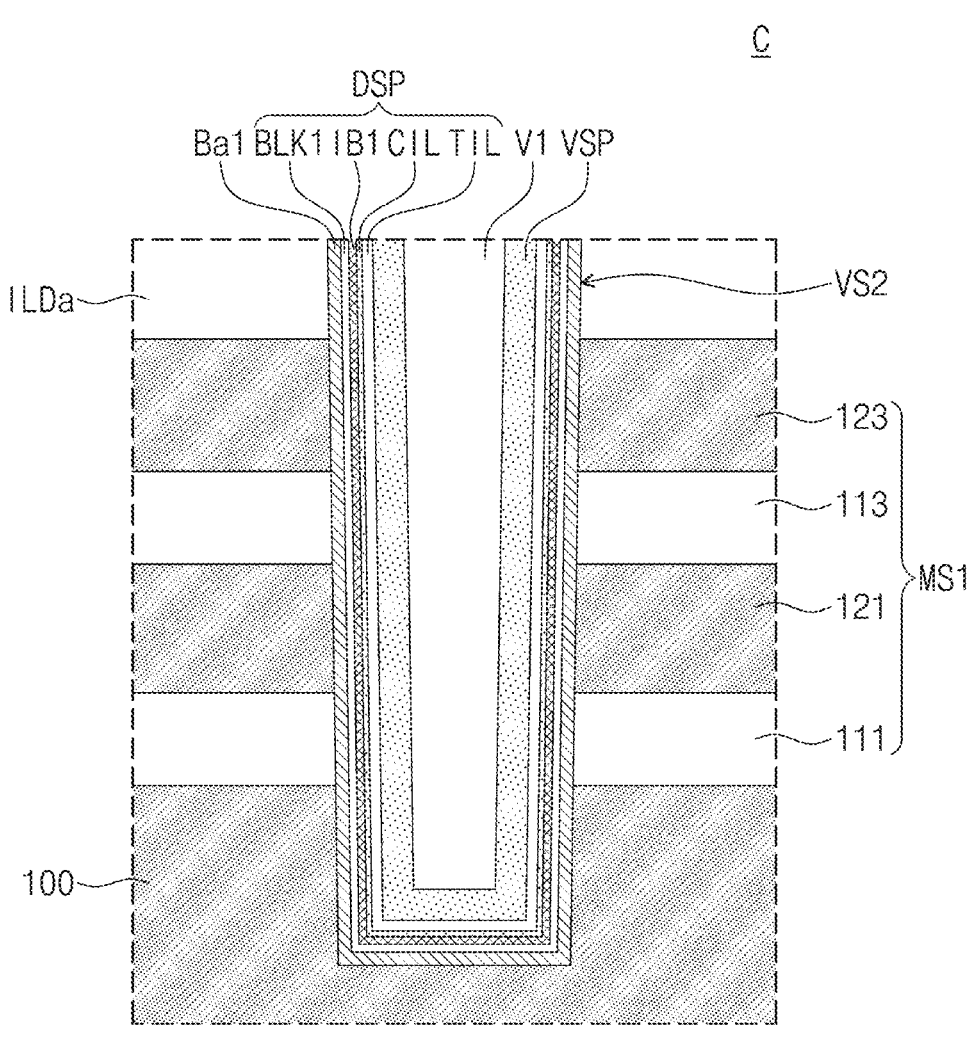
FIG. 7C illustrates an enlarged view of section C depicted in FIG. 6B, partially showing a three-dimensional semiconductor memory device according to various example embodiments.
Figure 7C:
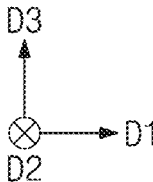

FIG. 7A illustrates an enlarged view of section A depicted in FIG. 6A, partially showing a three-dimensional semiconductor memory device according to various example embodiments. FIG. 7B illustrates an enlarged view of section B depicted in FIG. 6A, partially showing a three-dimensional semiconductor memory device according to various example embodiments. FIG. 7C illustrates an enlarged view of section C depicted in FIG. 6B, partially showing a three-dimensional semiconductor memory device according to various example embodiments.

Referring to FIGS. 6A, 7A, and 7B, there may be illustrated the source structure SC including the first and second source conductive patterns SCP1 and SCP2, and may also be illustrated one of the first vertical channel structures VS1 each including the first barrier pattern Ba1, the data storage pattern DSP, the vertical semiconductor pattern VSP, the buried dielectric pattern VI, and a lower data storage pattern DSPr. For convenience of description, the following will discuss a single stack structure ST and a single first vertical channel structure VS1, and the following discussion may also be applicable to other first vertical channel structures VS1 that penetrate other stack structures ST.

The data storage pattern DSP may include a first blocking dielectric layer BLK1, a first diffusion stop layer IB1, a charge storage layer CIL, and a tunneling dielectric layer TIL that are sequentially stacked. The first blocking dielectric layer BLK1 may be adjacent to the stack structure ST or the source structure SC, and the tunneling dielectric layer TIL may be adjacent to the vertical semiconductor pattern VSP. The charge storage layer CIL may be interposed between the first blocking dielectric layer BLK1 and the tunneling dielectric layer TIL. The first diffusion stop layer IB1 may be interposed between the first blocking dielectric layer BLK1 and the charge storage layer CIL. The charge storage layer CIL may be spaced apart from the first blocking dielectric layer BLK1 across the first diffusion stop layer IB1. The first blocking dielectric layer BLK1 may cover an inner sidewall of the first barrier pattern Ba1. The first blocking dielectric layer BLK1 may be spaced apart across the first barrier pattern Ba1 from the first and second interlayer dielectric layers ILDa and ILDb and the first and second gate electrodes ELa and ELb. The first barrier pattern Ba1 may conformally cover all or at least a portion of an inner sidewall of each of the vertical channel holes CH.

As the first diffusion stop layer IB1 is provided between the first blocking dielectric layer BLK1 and the charge storage layer CIL, when an oxidation process (such as a controlled thermal oxidation process) is performed on the first blocking dielectric layer BLK1, diffusion of various impurities such as oxygen into the charge storage layer CIL may be blocked to prevent, or at least partially prevent or reduce the likelihood of and/or impact from, oxidation of the charge storage layer CIL. Alternatively or additionally, the charge storage layer CIL may be prevented from, or at least partially prevented from or reduced in likelihood of and/or impact from receiving constituent materials (e.g., titanium, tungsten, etc.) diffusing from the first and second gate electrodes ELa and ELb. Accordingly, the three-dimensional semiconductor memory device according to various example embodiments may improve in reliability and/or electrical properties.

As the first barrier pattern Ba1 is provided on the inner sidewall of each of the vertical channel holes CH and not between each of the first and second interlayer dielectric layers ILDa and ILDb and each of the first and second gate electrodes ELa and ELb, it may be possible to reduce an overall thickness of the stack structure ST, and moreover to decrease a size of the three-dimensional semiconductor memory device according to various example embodiments.

The first blocking dielectric layer BLK1, the first diffusion stop layer IB1, the charge storage layer CIL, and the tunneling dielectric layer TIL may extend in the third direction D3 between the first barrier pattern Ba1 and the vertical semiconductor pattern VSP. The data storage pattern DSP may store and/or change data by using Fowler-Nordheim tunneling induced by a voltage difference between the vertical semiconductor pattern VSP and the first and second gate electrodes ELa and ELb. For example, the first blocking dielectric layer BLK1 and the tunneling dielectric layer TIL may include silicon oxide, and the charge storage layer CIL may include silicon nitride or silicon oxynitride and in some example embodiments may not include silicon oxide.

The first diffusion stop layer IB1 may include a low-k dielectric material. For example, the first diffusion stop layer IB1 may include a dielectric material having a dielectric constant of greater than about 0 and less than about 5. The dielectric material may have a bandgap of greater than about 5 eV and less than about 15 eV.

For example, the first diffusion stop layer IB1 may include boron nitride (BN). The boron nitride (BN) may have all possible phases, such as a hexagonal crystal structure, a cubic crystal structure, and a wurtzite crystal structure. The first diffusion stop layer IB1 may have a thickness of greater than about 0 Angstroms/Å (0 nm) and less than about 10 Å (1 nm).

As the first diffusion stop layer IB1 has a dielectric constant of greater than about 0 and less than about 5, although electrons are provided from the charge storage layer CIL to the first diffusion stop layer IB1, it may be possible to prevent or reduce the likelihood of and/or impact from lateral charge spreading in which electrons move in the third direction D3.

As the first diffusion stop layer IB1 have a small thickness of greater than about 0 Å and less than about 10 Å, no effect may be given to electrical properties of the data storage pattern DSP. Therefore, the first diffusion stop layer IB1 may be introduced without adjusting thicknesses of other layers included in the data storage pattern DSP.

The first source conductive pattern SCP1 of the source structure SC may be in contact with the vertical semiconductor pattern VSP, and the second source conductive pattern SCP2 of the source structure SC may be spaced apart from the vertical semiconductor pattern VSP across the first barrier pattern Ba1 and the data storage pattern DSP. The first source conductive pattern SCP1 may be spaced apart from the buried dielectric pattern VI across the vertical semiconductor pattern VSP.

For example, the first source conductive pattern SCP1 may include protrusions SCP1*bt* located at a level higher than that of a bottom surface SCP2*b* of the second source conductive pattern SCP2 or lower than that of a bottom surface SCP1*b* of the first source conductive pattern SCP1. The protrusions SCP1*bt* may be located at a level lower than that of a top surface SCP2*a* of the second source conductive pattern SCP2. The protrusions SCP1*bt* may each have, for example, a curved shape at a surface in contact with the data storage pattern DSP or the lower data storage pattern DSPr.

Referring to FIGS. 6A and 7A, a second blocking dielectric layer BLK2, a second diffusion stop layer IB2, and a second barrier pattern Ba2 may be provided between the first barrier pattern Ba1 and each of the first and second gate electrodes ELa and ELb. The second blocking dielectric layer BLK2 may be adjacent to the first barrier pattern Bat or the first vertical channel structure VS1. The second barrier pattern Ba2 may be adjacent to the first and second gate electrodes ELa and ELb. The second diffusion stop layer IB2 may be interposed between the second blocking dielectric layer BLK2 and the second barrier pattern Ba2. The second barrier pattern Ba2 may extend in the third direction D3 between the first barrier pattern Ba1 and each of the first and second gate electrodes ELa and ELb, and may extend onto top and bottom surfaces of each of the first and second gate electrodes ELa and ELb. The second diffusion stop layer IB2 may extend onto uppermost and lowermost surfaces of the second barrier pattern Ba2. The second blocking dielectric layer BLK2 may extend onto uppermost and lowermost surfaces of the second diffusion stop layer IB2. The second blocking dielectric layer BLK2 may be spaced apart from the first and second gate electrodes ELa and ELb across the second diffusion stop layer IB2.

The second blocking dielectric layer BLK2 may include a high-k dielectric material. The second blocking dielectric layer BLK2 may include, for example, at least one selected from aluminum oxide ($Al_2O_3$) and hafnium oxide ($HfO_2$).

The second diffusion stop layer IB2 may include a low-k dielectric material. For example, the second diffusion stop layer IB2 may include a dielectric material having a dielectric constant of greater than about 0 and less than about 5. The dielectric material may have a bandgap of greater than about 5 eV and less than about 15 eV.

For example, the second diffusion stop layer IB2 may include boron nitride (BN). The boron nitride (BN) may have all possible phases, such as a hexagonal crystal structure, a cubic crystal structure, and a wurtzite crystal structure. The second diffusion stop layer IB2 may have a thickness of greater than about 0 Å and less than about 10 Å. The second diffusion stop layer IB2 may include a material the same as or different from that of the first diffusion stop layer IB1.

The second barrier pattern Ba2 may include a material different from that of the first and second gate electrodes ELa and ELb and that of the first barrier pattern Ba1. The second barrier pattern Ba2 may include, for example, at least one selected from tantalum nitride, tantalum silicon nitride, titanium nitride, titanium silicon nitride, and tungsten nitride.

As the second diffusion stop layer IB2 is provided between the second blocking dielectric layer BLK2 and the first and second gate electrodes ELa and ELb, nitrogen may be suppressed from being diffused from the second barrier pattern Ba2 into the second blocking dielectric layer BLK2, and thus gate electrodes may be prevented from or reduced in likelihood of occurrence and/or impact from their short-circuit due to nitrogenization of the second blocking dielectric layer BLK2. In conclusion, the three-dimensional semiconductor memory device according to various example embodiments may improve in reliability and/or electrical properties.

Referring to FIGS. 6B and 7C, there may be illustrated one of the second vertical channel structures VS2 each including the first barrier pattern Ba1, the data storage pattern DSP, the vertical semiconductor pattern VSP, and the buried dielectric pattern VI, and there may also be illustrated the first mold structure MS1 including the first and second buffer dielectric layers 111 and 113 and the first and second semiconductor layers 121 and 123.

The first and second buffer dielectric layers 111 and 113 and the first and second semiconductor layers 121 and 123 may be spaced apart from the data storage pattern DSP across the first barrier pattern Ba1. In addition, the second substrate 100 may be spaced apart from the data storage pattern DSP across the first barrier pattern Ba1. For example, the first and second buffer dielectric layers 111 and 113, the first and second semiconductor layers 121 and 123, and the second substrate 100 may not be in contact with any of the data storage pattern DSP and the vertical semiconductor pattern VSP of each of the second vertical channel structures VS2.

Figure 8A:
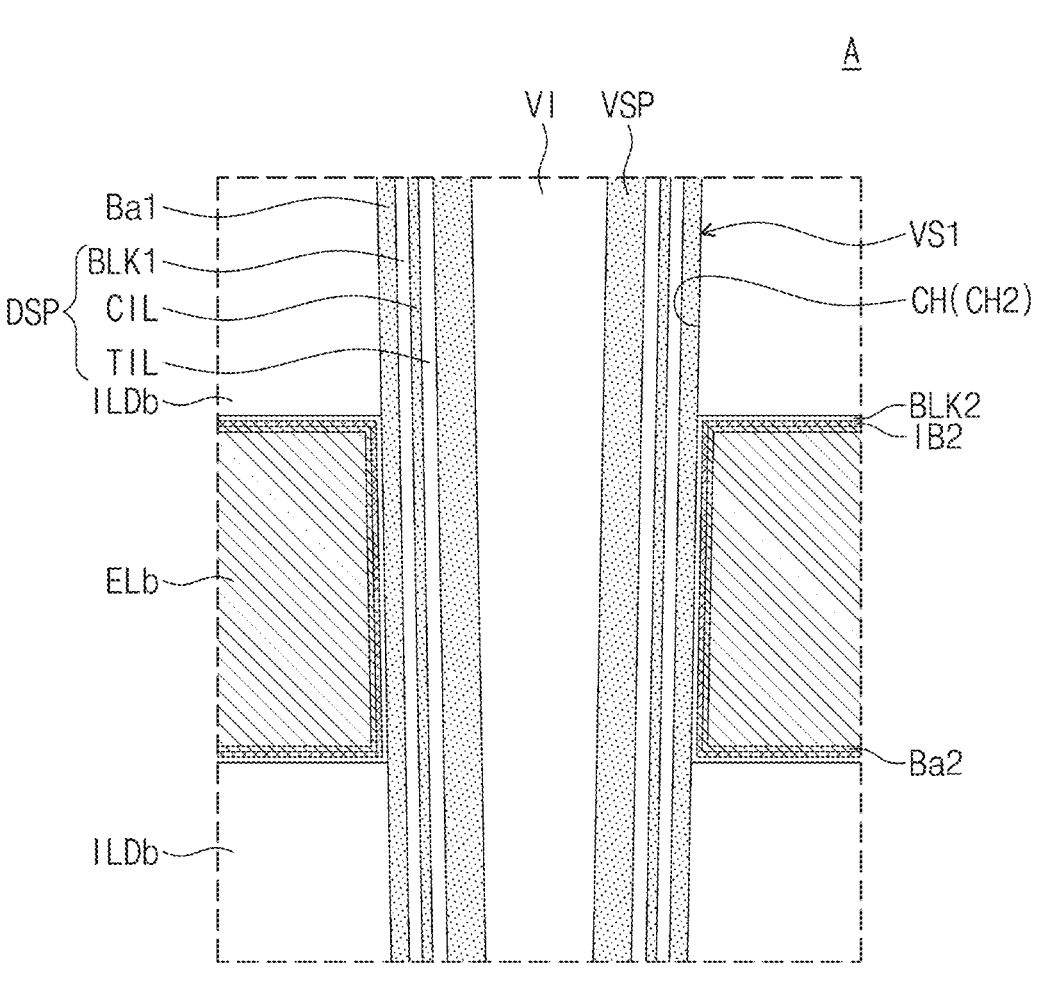
FIG. 8A illustrates an enlarged view of section A depicted in FIG. 6A, partially showing a three-dimensional semiconductor memory device according to various example embodiments.
Figure 8A:
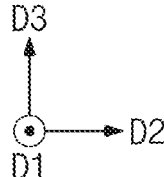

FIG. 8A illustrates an enlarged view of section A depicted in FIG. 6A, partially showing a three-dimensional semiconductor memory device according to various example embodiments. The following will omit a description of components substantially the same as those discussed with reference to FIGS. 7A to 7C.

Referring to FIGS. 6A and 8A, according to some example embodiments, differently from FIGS. 7A, 7B, and 7C, the first diffusion stop layer IB1 may not be provided between the first blocking dielectric layer BLK1 and the charge storage layer CIL. The first blocking dielectric layer BLK1 and the charge storage layer CIL may be in contact with each other.

Figure 8B:
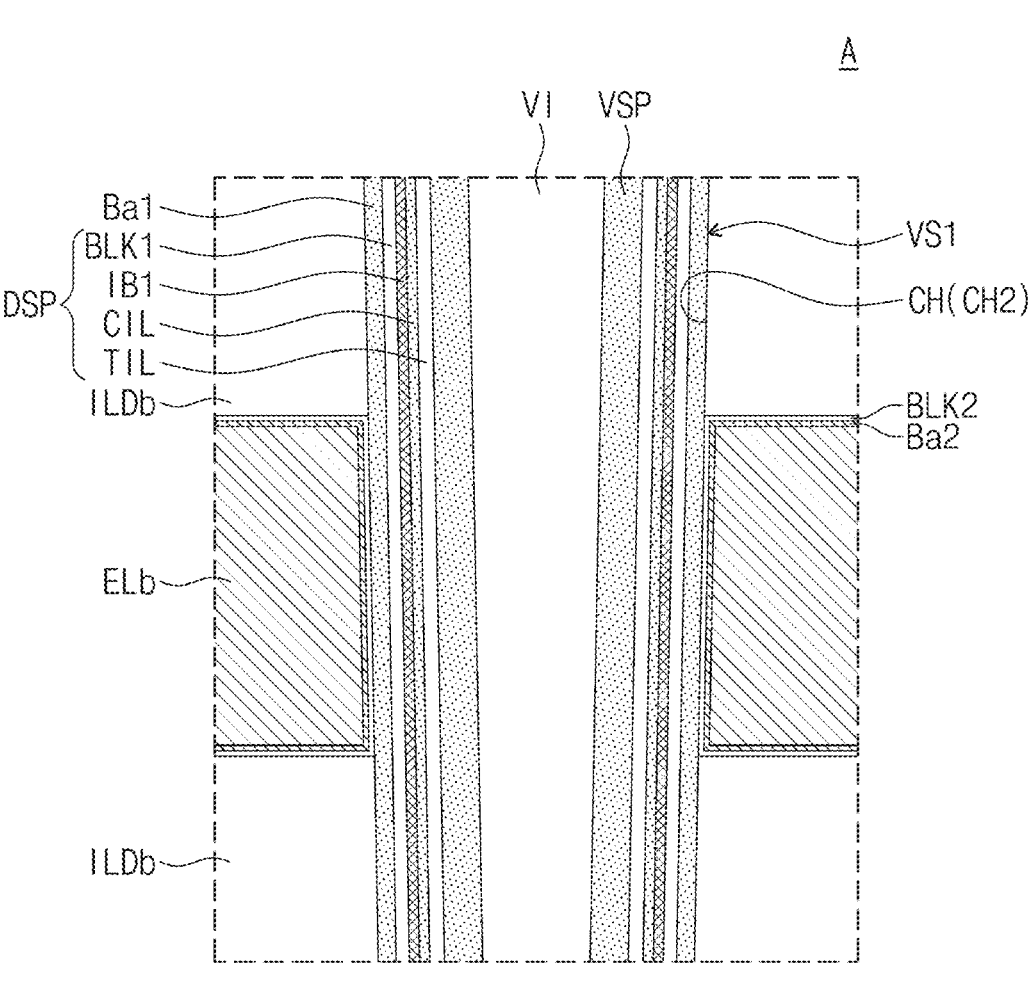
FIG. 8B illustrates an enlarged view of section A depicted in FIG. 6A, partially showing a three-dimensional semiconductor memory device according to various example embodiments.
Figure 8B:
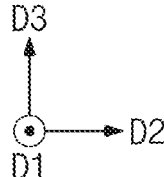

FIG. 8B illustrates an enlarged view of section A depicted in FIG. 6A, partially showing a three-dimensional semiconductor memory device according to various example embodiments. The following will omit a description of components substantially the same as those discussed with reference to FIGS. 7A to 7C.

Referring to FIGS. 6A and 8B, according to some example embodiments, differently from FIG. 7A, the second diffusion stop layer IB2 may not be provided between the second barrier pattern Ba2 and the second blocking dielectric layer BLK2. In this case, the second barrier pattern Ba2 and the second blocking dielectric layer BLK2 may be in contact with each other.

FIGS. 9 to 11A illustrate cross-sectional views taken along line I-I' of FIG. 5, showing a method of fabricating a three-dimensional semiconductor memory device according to various example embodiments. FIG. 11B illustrates an enlarged view of section D depicted in FIG. 11A, partially showing a three-dimensional semiconductor memory device according to some embodiments. FIGS. 12 to 17 illustrate cross-sectional views taken along line I-I' of FIG. 5, showing a method of fabricating a three-dimensional semiconductor memory device according to various example embodiments. With reference to FIGS. 5, 6A, 6B, and 9 to 17, the following will describe in detail a method of fabricating a three-dimensional semiconductor memory device according to various example embodiments.

Figure 9:
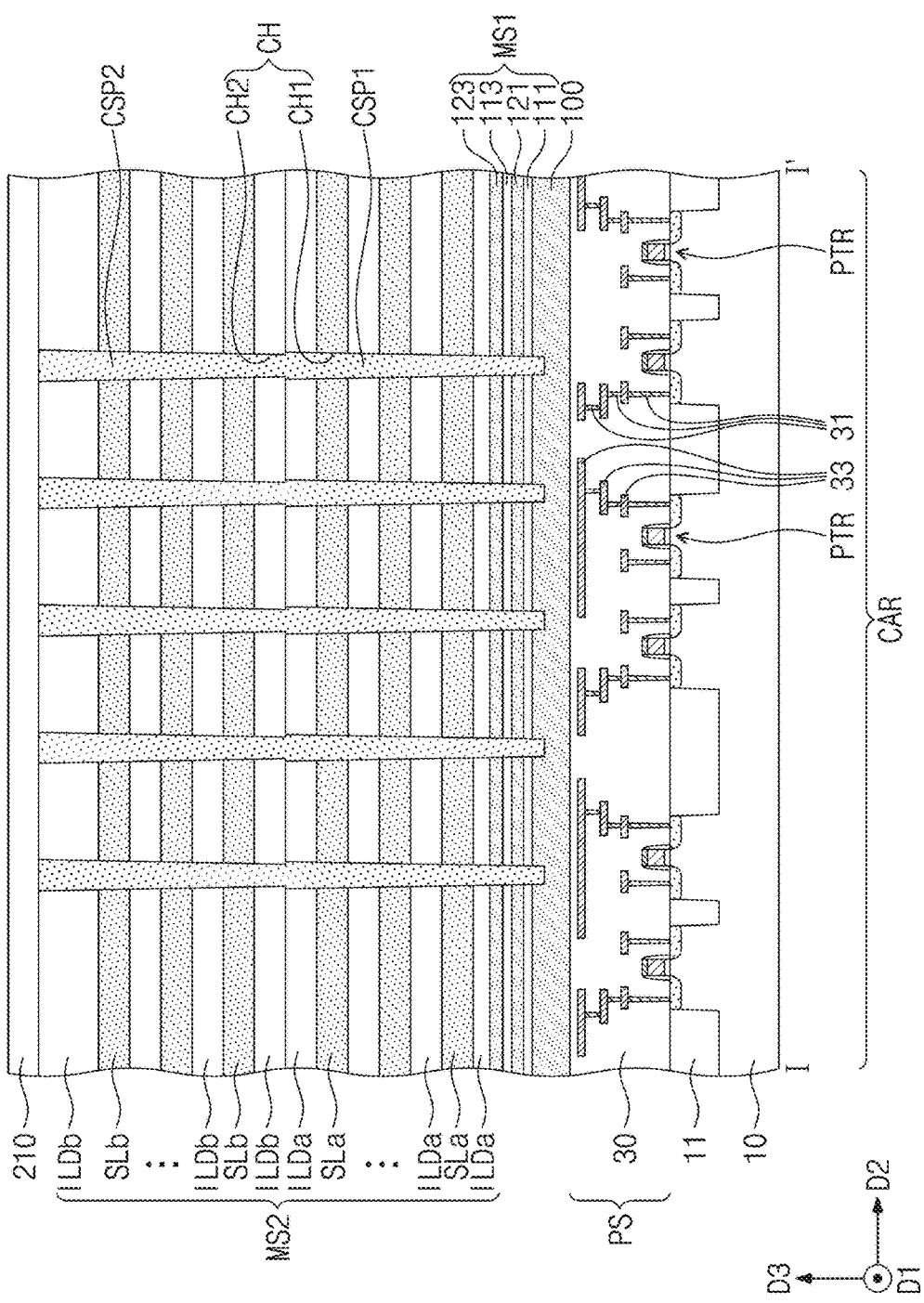

Referring to FIGS. 5 and 9, a first substrate 10 may be provided which includes a cell array region CAR and a contact region CCR. A device isolation layer 11 may be formed in the first substrate 10, defining an active section. The device isolation layer 11 may be formed by forming a trench on an upper portion of the first substrate 10 and filling the trench with silicon oxide. The trench may be planarized, e.g. planarized with a chemical mechanical planarization (CMP) process; however, example embodiments are not limited thereto.

Peripheral circuit transistors PTR may be formed on the active section defined by the device isolation layer 11. Peripheral contact plugs 31 and peripheral circuit lines 33 may be formed to connect with peripheral source/drain sections 29 of the peripheral circuit transistors PTR. A first dielectric layer 30 may be formed to cover the peripheral circuit transistors PTR, the peripheral contact plugs 31, and the peripheral circuit lines 33.

A second substrate 100 may be provided on, or formed on the first dielectric layer 30. The second substrate 100 may extend from the cell array region CAR toward the contact region CCR.

A portion of the second substrate 100 may be removed from the contact region CCR. The partial removal of the second substrate 100 may include forming a mask pattern that covers the cell array region CAR and a portion of the contact region CCR, and then using the mask pattern to pattern the second substrate 100. The partial removal of the second substrate 100 may include forming a space where a peripheral contact plug TCP will be provided as discussed below.

A first mold structure MS1 may be formed on the second substrate 100. The formation of the first mold structure MS1 may include sequentially stacking a first buffer dielectric layer 111, a first semiconductor layer 121, a second buffer dielectric layer 113, and a second semiconductor layer 123 on the second substrate 100. The first and second buffer dielectric layers 111 and 113 may be include or be formed of, for example, silicon oxide. The first and second semiconductor layers 121 and 123 may be formed of a material having an etch selectivity with respect to a first barrier pattern Ba1 which will be discussed below. The first and second semiconductor layers 121 and 123 may include or be formed of a semiconductor material, such as silicon, and may or may not be formed of the same material.

A second mold structure MS2 may be formed on the first mold structure MS1. The formation of the second mold structure MS2 may include alternately stacking first interlayer dielectric layers ILDa and first sacrificial layers SLa on the second substrate 100, forming first vertical channel holes CH1 that penetrate the first interlayer dielectric layers ILDa and the first sacrificial layers SLa, forming a first channel sacrificial pattern CSP1 that fills each of the first vertical channel holes CH1, alternately stacking second interlayer dielectric layers ILDb and second sacrificial layers SLb on an uppermost one of the first interlayer dielectric layers ILDa, forming second vertical channel holes CH2 that penetrate the second interlayer dielectric layers ILDb and the second sacrificial layers SLb and are connected to the first vertical channel holes CH1, and forming a second channel sacrificial pattern CSP2 that fills each of the second vertical channel holes CH2 and is connected to the first channel sacrificial pattern CSP1. The first vertical channel holes CH1 may penetrate the first mold structure MS1 in addition to the first interlayer dielectric layers ILDa and the first sacrificial layers SLa, and may further penetrate at least a portion of the second substrate 100.

Before the formation of the first vertical channel holes CH1 and the second vertical channel holes CH2, a trimming process may be performed on the second mold structure MS2 on the contact region CCR. The trimming process may include forming a mask pattern that partially covers a top surface of the second mold structure MS2 on the cell array region CAR and the contact region CCR, using the mask pattern to pattern the second mold structure MS2, reducing an area of the mask pattern, and using the reduced mask pattern to pattern the second mold structure MS2. The reducing the area of the mask pattern and the using the reduced mask pattern to pattern the second mold structure MS2 may be performed alternately and repeatedly. The trimming process may cause the second mold structure MS2 to have a stepwise structure or a staircase structure.

The first and second sacrificial layers SLa and SLb may be formed of a dielectric material different from that of the first and second interlayer dielectric layers ILDa and ILDb. The first and second sacrificial layers SLa and SLb may be formed of a material having an etch selectivity with respect to the first and second interlayer dielectric layers ILDa and ILDb. For example, the first and second sacrificial layers SLa and SLb may be formed of silicon nitride and may not include silicon oxide, and the first and second interlayer dielectric layers ILDa and ILDb may be formed of silicon oxide and may not include silicon nitride. The first and second sacrificial layers SLa and SLb may be formed to have substantially the same thickness, and the first and second interlayer dielectric layers ILDa and ILDb may be formed to have their thicknesses that are changed at certain portions thereof.

A first dielectric pattern 210 may be formed on the second mold structure MS2. The first dielectric pattern 210 may cover the top surface of the second mold structure MS2 (or a top surface of an uppermost one of the second interlayer dielectric layers ILDb) and a top surface of the second channel sacrificial pattern CSP2.

Figure 10:
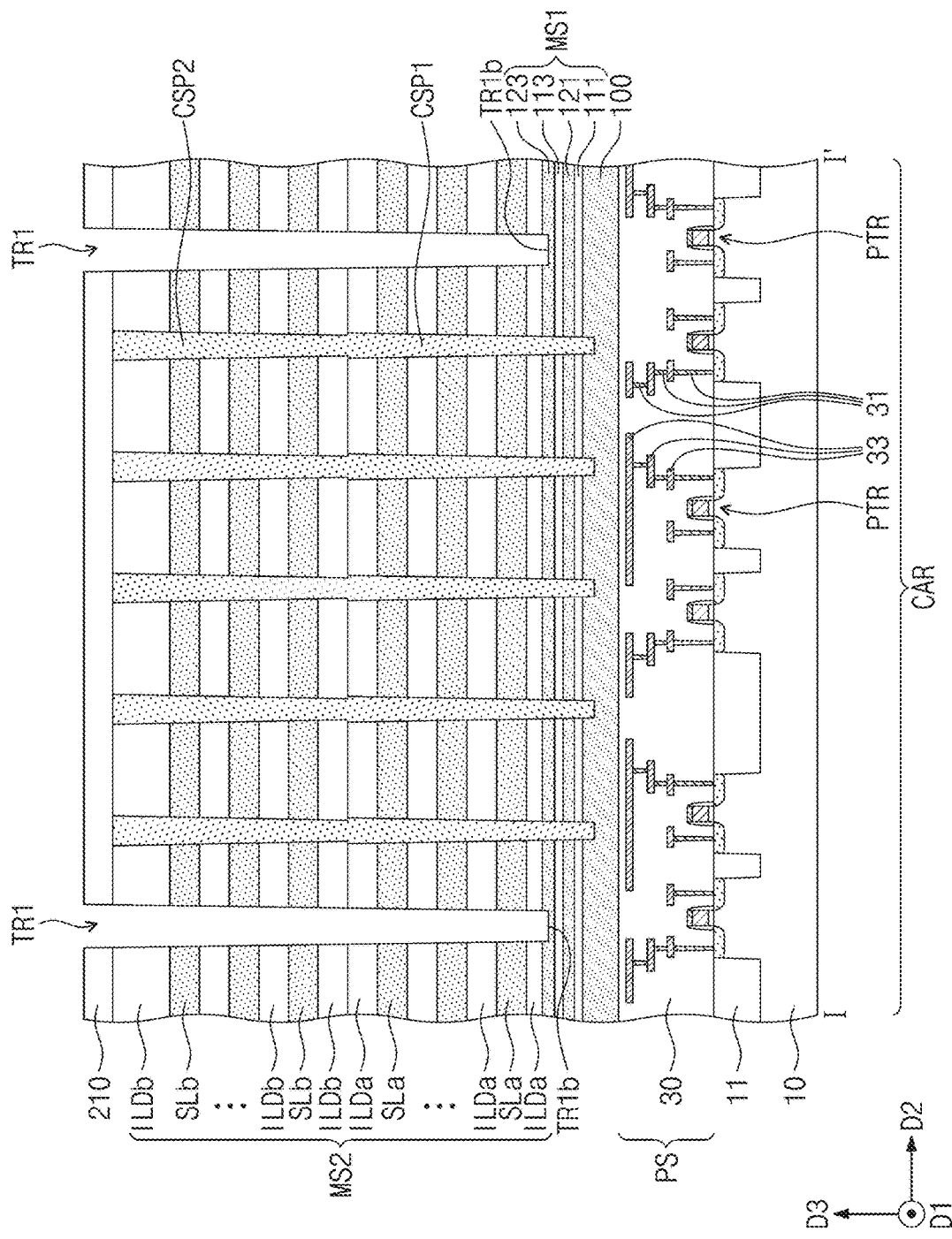

Referring to FIGS. 5 and 10, a first trench TR1 may be formed to penetrate the first dielectric pattern 210 and the second mold structure MS2. The first trench TR1 may further penetrate at least a portion of the first mold structure MS1 (e.g., at least a portion of the second semiconductor layer 123). The first trench TR1 may have a bottom surface TR1b located at a level lower than that of a bottom surface of the second mold structure MS2 (or a bottom surface of a lowermost one of the first interlayer dielectric layers ILDa) and that of a top surface of the first mold structure MS1. The first trench TR1 may expose sidewalls of the first and second interlayer dielectric layers ILDa and ILDb and sidewalls of the first and second sacrificial layers SLa and SLb. The first trench TR1 may extend from the cell array region CAR toward the contact region CCR.

Figure 11A:
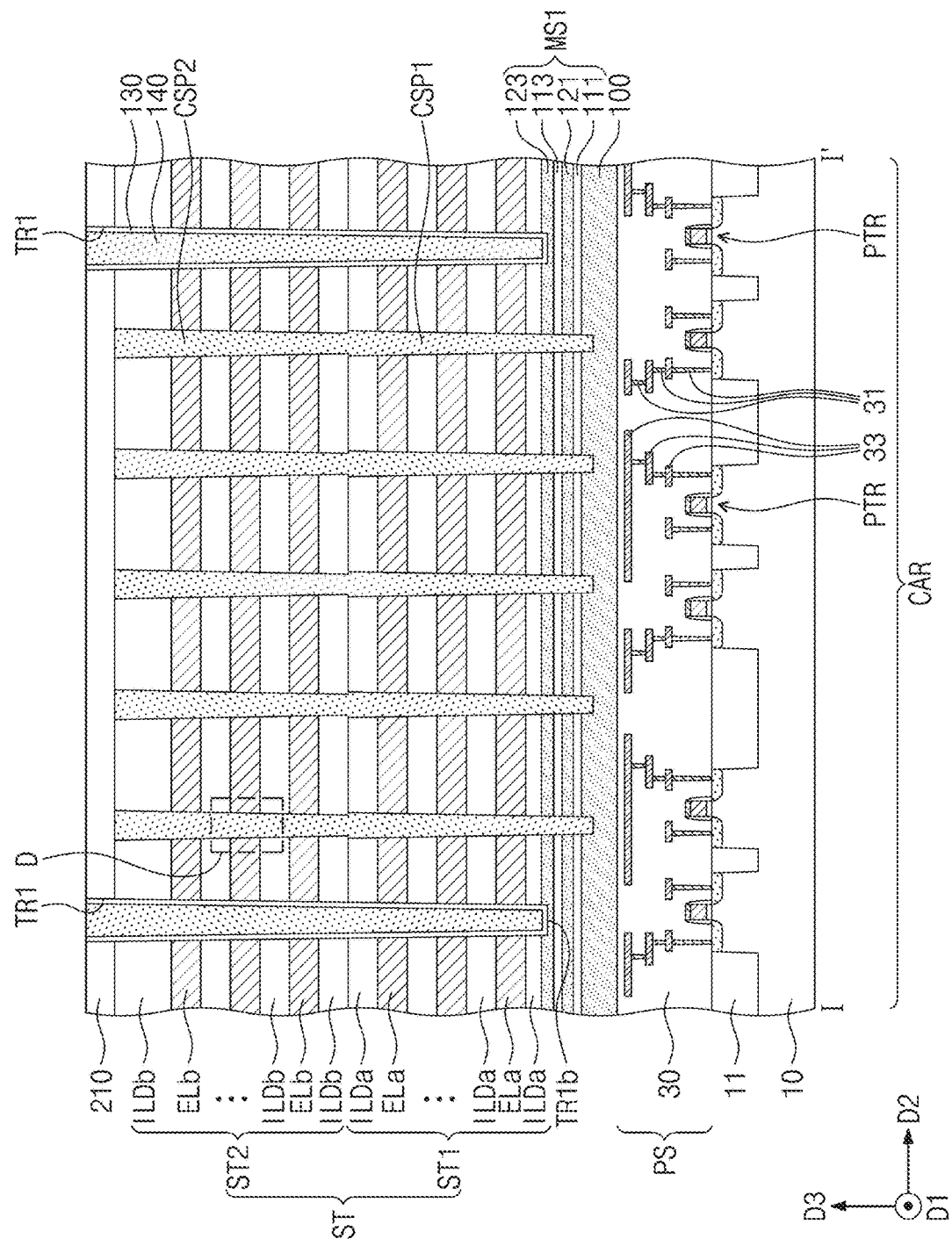

Referring to FIG. 11A, the first and second sacrificial layers SLa and SLb exposed by the first trench TR1 may be selectively removed. The selective removal of the first and second sacrificial layers SLa and SLb may be achieved by a wet etching process that uses an etchant. First and second gate electrodes ELa and ELb may be formed to fill spaces where the first and second sacrificial layers SLa and SLb are removed. A stack structure ST may be formed to include the first and second gate electrodes ELa and ELb and the first and second interlayer dielectric layers ILDa and ILDb.

Figure 11B:
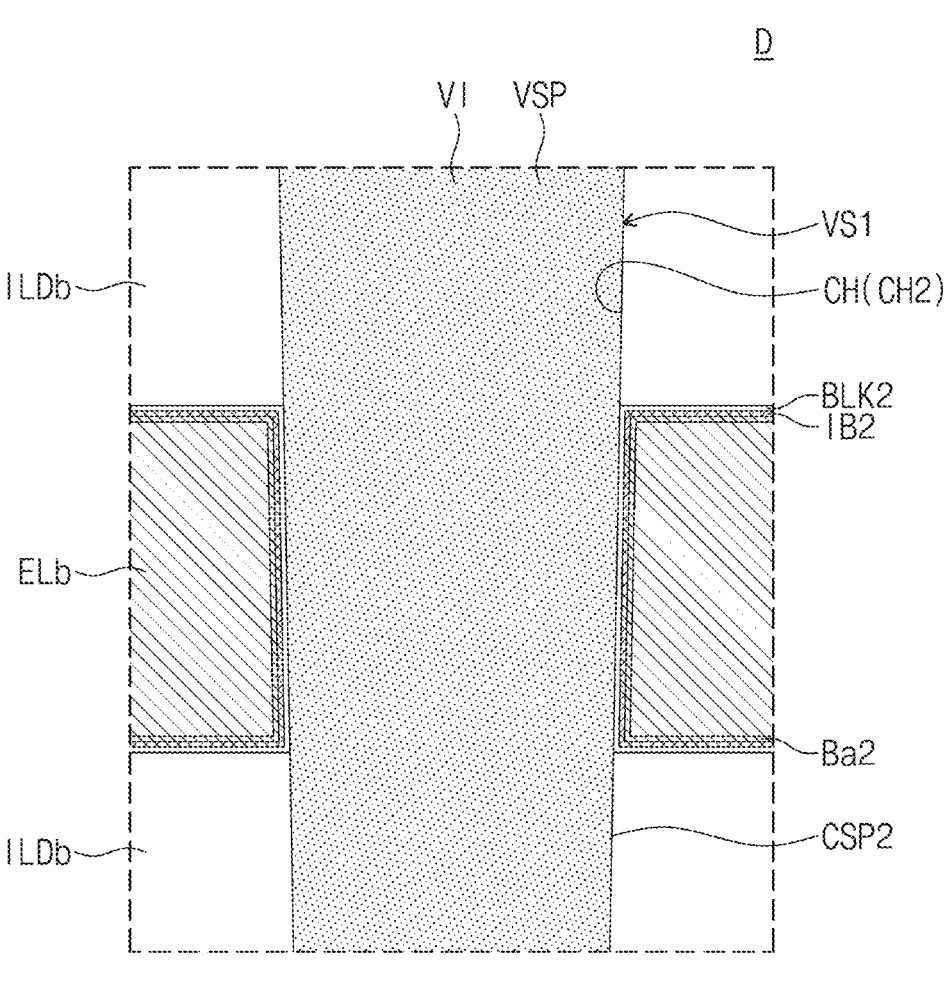
FIG. 11B illustrates an enlarged view of section D depicted in FIG. 11A, partially showing a three-dimensional semiconductor memory device according to some embodiments of the present inventive concept.
Figure 11B:
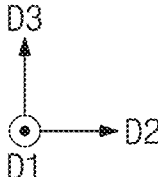

Referring to FIG. 11B, the formation of the first and second gate electrodes ELa and ELb may include sequentially forming a second blocking dielectric layer BLK2, a second diffusion stop layer IB2, and a second barrier pattern Ba2. The second blocking dielectric layer BLK2 may cover, e.g. may conformally cover top and bottom surfaces of the first and second interlayer dielectric layers ILDa and ILDb and sidewalls of the first and second channel sacrificial patterns CSP1 and CSP2, and may fill at least a portion of the space where the first and second sacrificial layers SLa and SLb are removed. The second diffusion stop layer IB2 may cover, e.g. may conformally cover a top surface, a bottom surface, and sidewalls of the second blocking dielectric layer BLK2, and may fill at least a portion of the space where the first and second sacrificial layers SLa and SLb are removed. The second barrier pattern Ba2 may cover, e.g. may conformally cover a top surface, a bottom surface, and sidewalls of the second diffusion stop layer IB2, and may fill at least a portion of the space where the first and second sacrificial layers SLa and SLb are removed.

The second diffusion stop layer IB2 may be formed by a deposition process. The deposition process may include one or more of low-pressure chemical vapor deposition (LPCVD), plasma enhanced chemical vapor deposition (PECVD), atomic layer deposition (ALD), or plasma enhanced atomic layer deposition (PEALD).

As the first and second gate electrodes ELa and ELb are formed before forming first and second vertical channel structures VS1 and VS2 which will be discussed below, the first and second vertical channel structures VS1 and VS2 may be prevented from, or reduced in likelihood of occurrence and/or impact from, being partially etched when the first and second sacrificial layers SLa and SLb are removed. Accordingly, a three-dimensional semiconductor memory device according to various example embodiments may improve in reliability and electrical properties.

A separation spacer 130 and a separation sacrificial pattern 140 may be formed to fill the first trench TR1. The separation spacer 130 and the separation sacrificial pattern 140 may extend from the cell array region CAR toward the contact region CCR.

Figure 12:
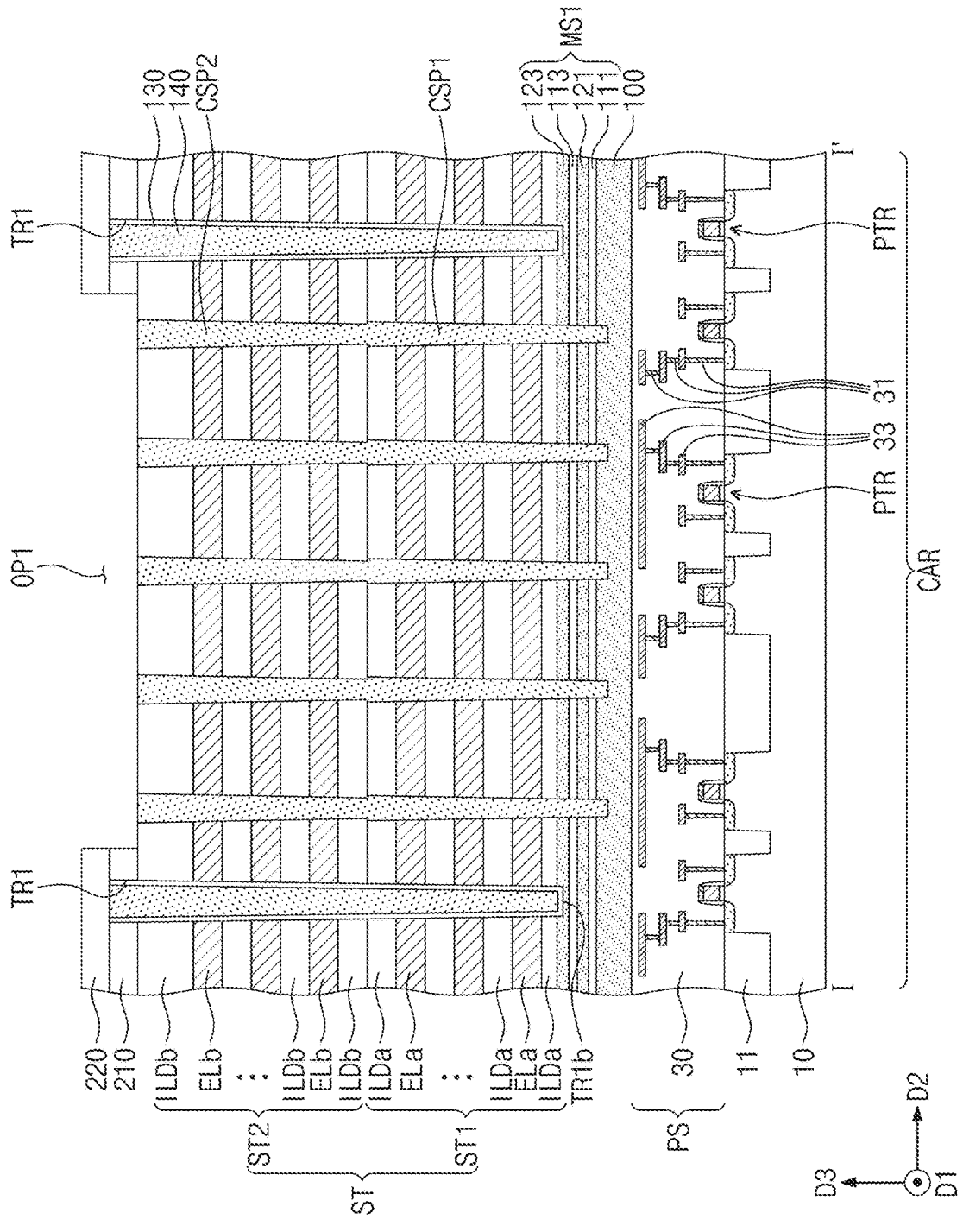
FIGS. 12 to 17 illustrate cross-sectional views taken along line I-I' of FIG. 5, showing a method of fabricating a three-dimensional semiconductor memory device according to various example embodiments.

Referring to FIG. 12, a second dielectric pattern 220 may be formed to partially cover a top surface of the first dielectric pattern 210. The second dielectric pattern 220 may be used as a mask to perform an etching process. The etching process may form a first opening OP1. The first opening OP1 may expose a portion of a top surface of the stack structure ST and the top surface of the second channel sacrificial pattern CSP2. The first opening OP1 may expose neither the separation spacer 130 nor the separation sacrificial pattern 140. For example, the first and second dielectric patterns 210 and 220 may cover the separation spacer 130 and the separation sacrificial pattern 140.

Figure 13:
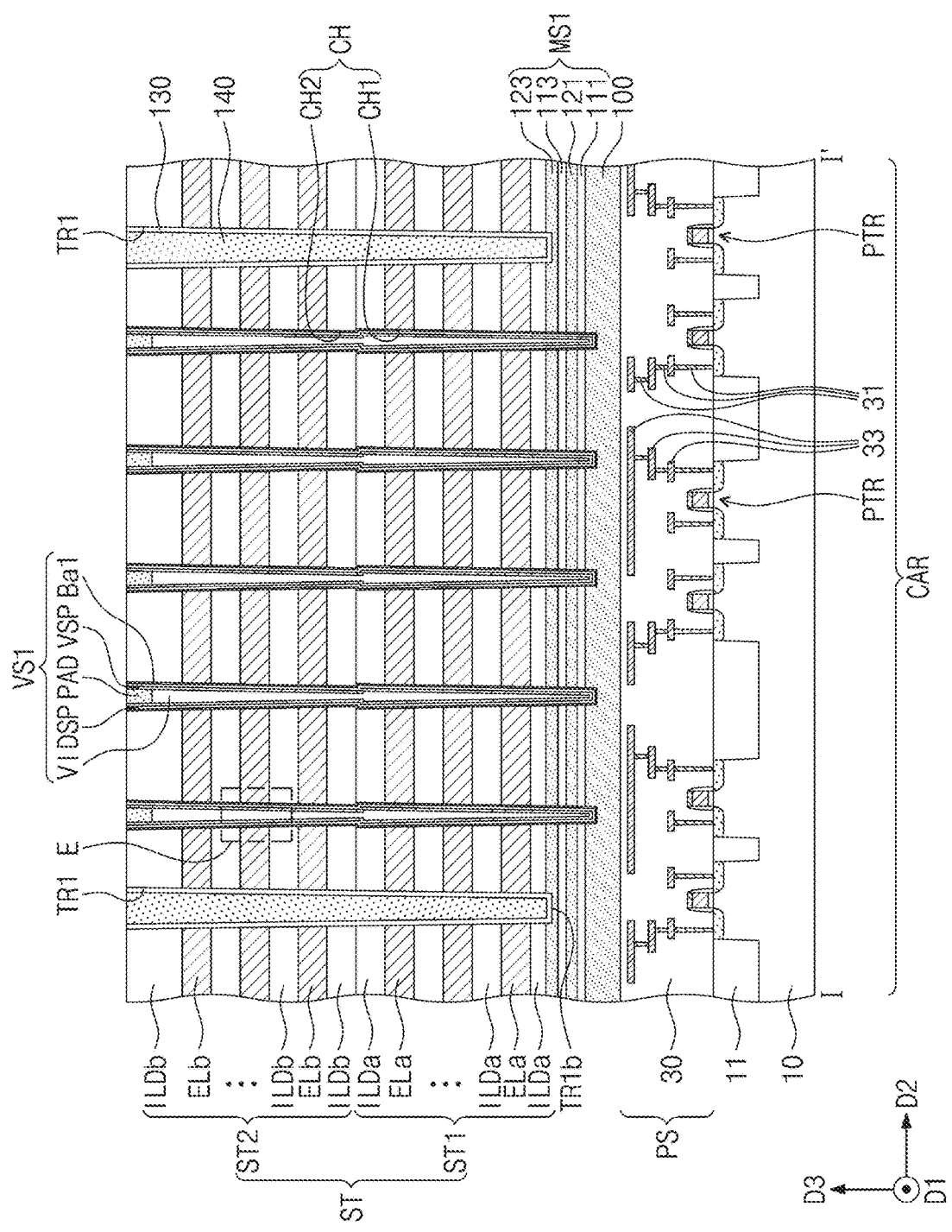

Referring to FIGS. 12 and 13, a removal action may be performed on the second channel sacrificial pattern CSP2 and the first channel sacrificial pattern CSP1 that are exposed by the first opening OP1. On the cell array region CAR, first vertical channel structures VS1 may be formed in spaces (or vertical channel holes CH) where the first and second channel sacrificial patterns CSP1 and CSP2. Likewise, on the contact region CCR, second vertical channel structures VS2 may be formed to fill the vertical channel holes CH.

The formation of each of the first and second vertical channel structures VS1 and VS2 may include forming a first barrier pattern Ba1 that covers, e.g. conformally covers an inner sidewall of each of the vertical channel holes CH, forming a data storage pattern DSP that covers, e.g. conformally covers an inner sidewall of the first barrier pattern Ba1, forming a vertical semiconductor pattern VSP that covers, e.g. conformally covers an inner sidewall of the data storage pattern DSP, forming a buried dielectric pattern VI that fills all or at least a portion of a space surrounded by the vertical semiconductor pattern VSP, and forming a conductive pad PAD that fills a space surrounded by the vertical semiconductor pattern VSP and the buried dielectric pattern VI.

An enlarged view of section E depicted in FIG. 13 may be substantially the same as that of FIG. 7A. Referring to FIGS. 7A, 11B, and 13, when forming the data storage pattern DSP, a first diffusion stop layer IB1 may be formed by the same way used for forming the second diffusion stop layer IB2.

After the formation of the first and second vertical channel structures VS1 and VS2, the first and second dielectric patterns 210 and 220 may be removed. In addition, a portion of each of the separation spacer 130 and the separation sacrificial pattern 140 may be removed together with the first dielectric pattern 210, and the top surface of the stack structure ST may be outwardly exposed.

Figure 14:
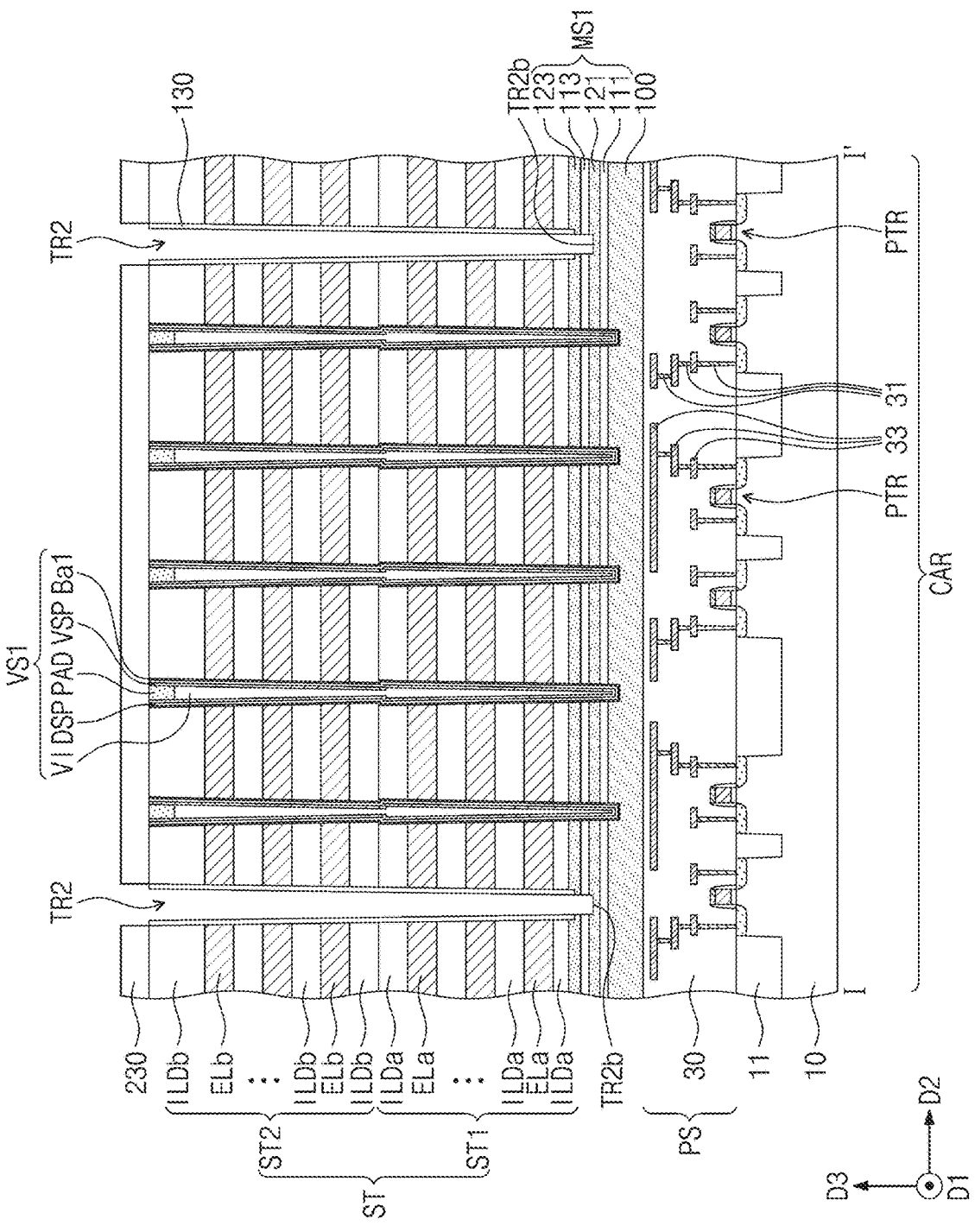

Referring to FIGS. 5 and 14, a third dielectric pattern 230 may be formed on the top surface of the stack structure ST. The third dielectric pattern 230 may correspond to the third dielectric layer 230 discussed with reference to FIGS. 6A and 6B. In the following description, the third dielectric pattern 230 may be called the third dielectric layer 230.

The third dielectric layer 230 may outwardly expose a top surface of the separation sacrificial pattern 140. The separation sacrificial pattern 140 exposed by the third dielectric layer 230 may be selectively removed to form a second trench TR2. On the cell array region CAR, at least a portion of the first mold structure MS1 may be removed together with the separation sacrificial pattern 140. The first mold structure MS1 on the contact region CCR may not be removed.

The second trench TR2 may extend from the cell array region CAR toward the contact region CCR. On the cell array region CAR, a bottom surface TR2b of the second trench TR2 may be positioned between a top surface of the first semiconductor layer 121 and a top surface of the second substrate 100.

Figure 15:
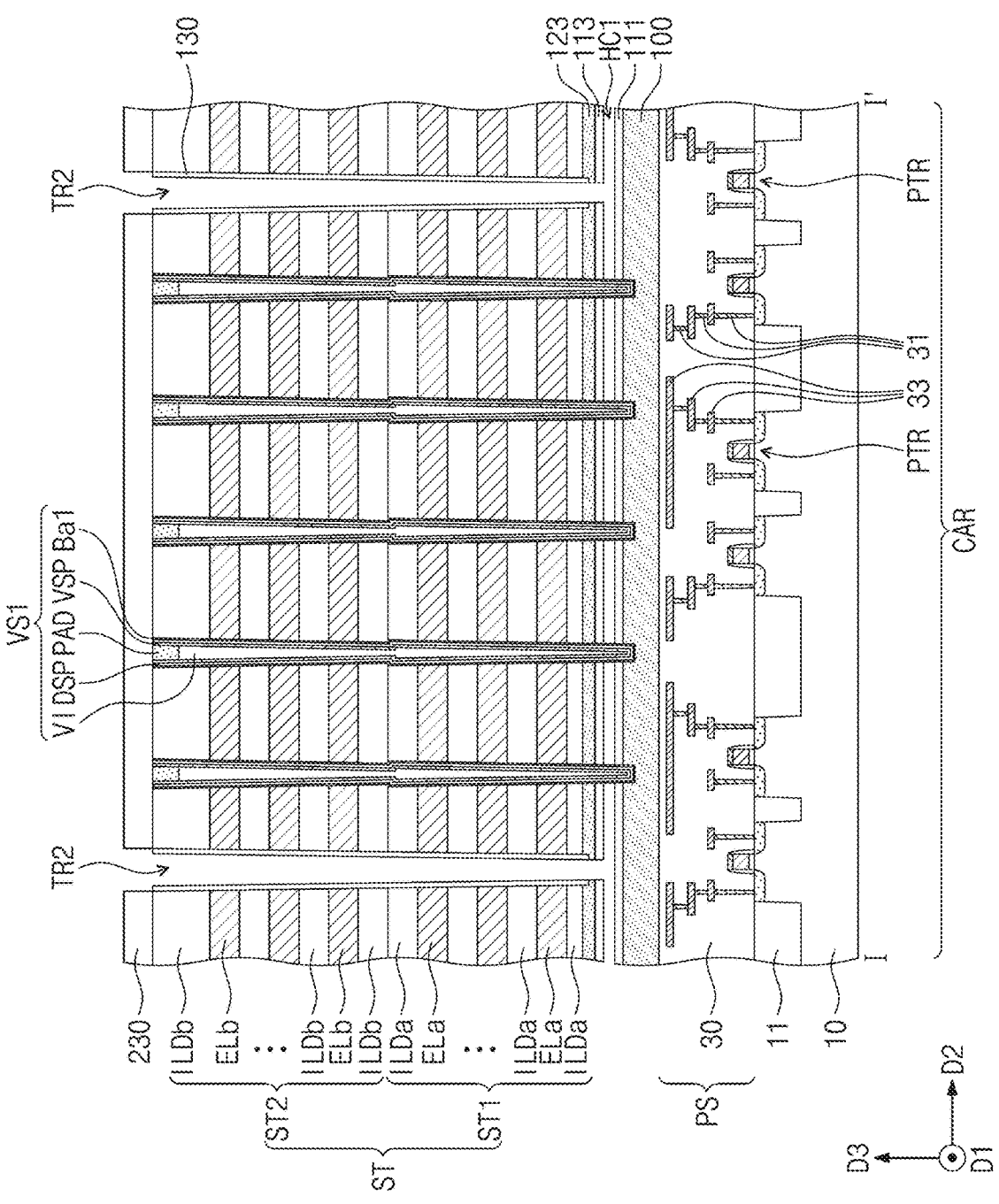

Referring to FIG. 15, the first semiconductor layer 121 exposed by the second trench TR2 may be selectively removed. The selective removal of the first semiconductor layer 121 may be achieved by a wet etching process that uses an etchant. The first semiconductor layer 121 may be removed to form a first horizontal cavity HC1 between a top surface of the first buffer dielectric layer 111 and a bottom surface of the second buffer dielectric layer 113. The first horizontal cavity HC1 may indicate an empty space between the first and second buffer dielectric layers 111 and 113. The first horizontal cavity HC1 may expose a portion of the first barrier pattern Ba1 of each of the first vertical channel structures VS1.

As the first semiconductor layer 121 has an etch selectivity with respect to the first barrier pattern Bat, when forming the first horizontal cavity HC1, it may be possible to prevent or minimize, or reduce the likelihood of and/or impact from damage to the first barrier pattern Ba1 and the data storage pattern DSP that is surrounded by the first barrier pattern Bat.

The first semiconductor layer 121 may be removed from the cell array region CAR, while leaving the first mold structure MS1 on the contact region CCR or a portion of the first semiconductor layer 121 provided on the contact region CCR.

Figure 16:
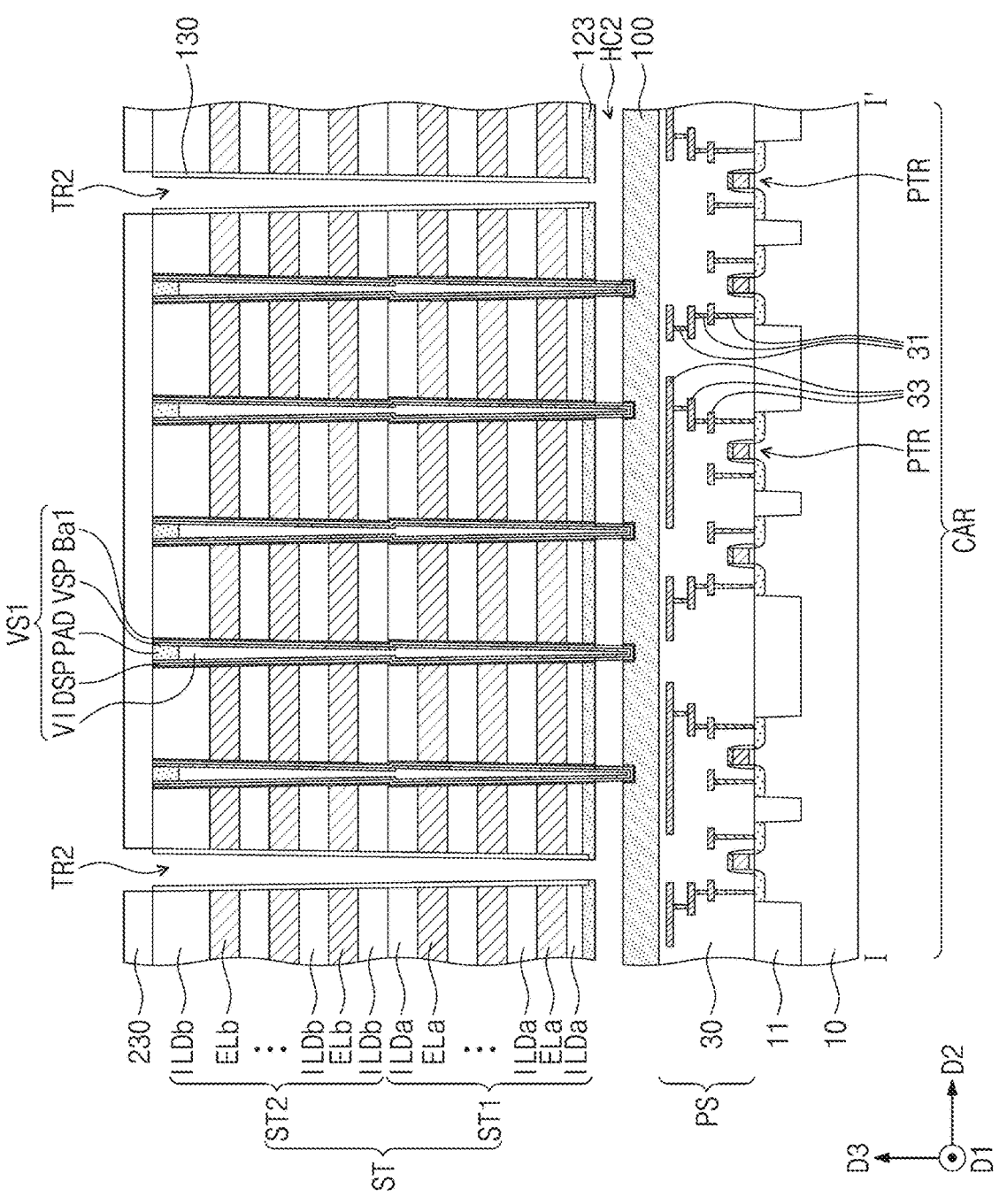

Referring to FIGS. 15 and 16, the first and second buffer dielectric layers 111 and 113 exposed by the first horizontal cavity HC1 may be removed to form a second horizontal cavity HC2. The second horizontal cavity HC2 may indicate an empty space between the second substrate 100 and the second semiconductor layer 123. In addition, a removal action may be performed on a portion of the data storage pattern DSP and a portion of the first barrier pattern Ba1 exposed by the second horizontal cavity HC2. The second horizontal cavity HC2 may expose a portion of the vertical semiconductor pattern VSP of each of the first vertical channel structures VS1.

The first and second buffer dielectric layers 111 and 113 may be removed from the cell array region CAR, while leaving the first mold structure MS1 on the contact region CCR or a portion of each of the first and second buffer dielectric layers 111 and 113 provided on the contact region CCR.

Figure 17:
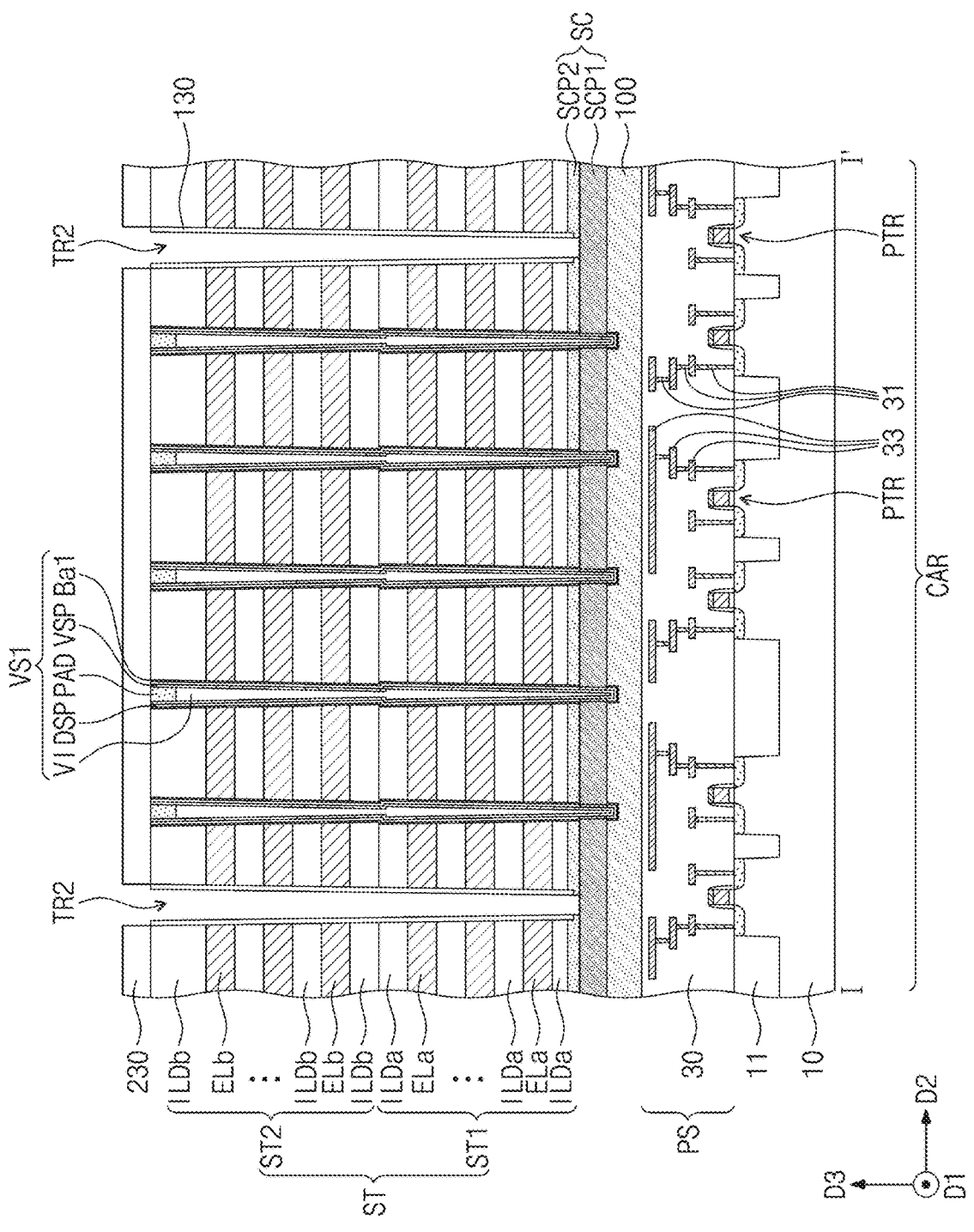

Referring to FIGS. 16 and 17, a first source conductive pattern SCP1 may be formed to fill the second horizontal cavity HC2. Although not shown, an air gap may be formed in the first source conductive pattern SCP1. The second semiconductor layer 123 on the cell array region CAR may be called a second source conductive pattern SCP2, and a source structure SC may be formed to include the first and second source conductive patterns SCP1 and SCP2.

Referring back to FIGS. 5, 6A, and 6B, a separation structure 150 may be formed to fill the second trench TR2. The separation structure 150 may have a top surface substantially coplanar with that of the third dielectric layer 230.

Bit-line contact plugs BLCP may be formed to penetrate the third dielectric layer 230, cell contact plugs CCP may be formed to penetrate the third dielectric layer 230 and the second dielectric layer 170, and a peripheral contact plug TCP may be formed to penetrate the third dielectric layer 230, the second dielectric layer 170, and at least a portion of the first dielectric layer 30. On the third dielectric layer 230, bit lines BL may be formed to connect with the bit-line contact plugs BLCP, first conductive lines CL1 may be formed to connect with the cell contact plugs CCP, and a second conductive line CL2 may be formed to connect with the peripheral contact plug TCP.

Figure 18:
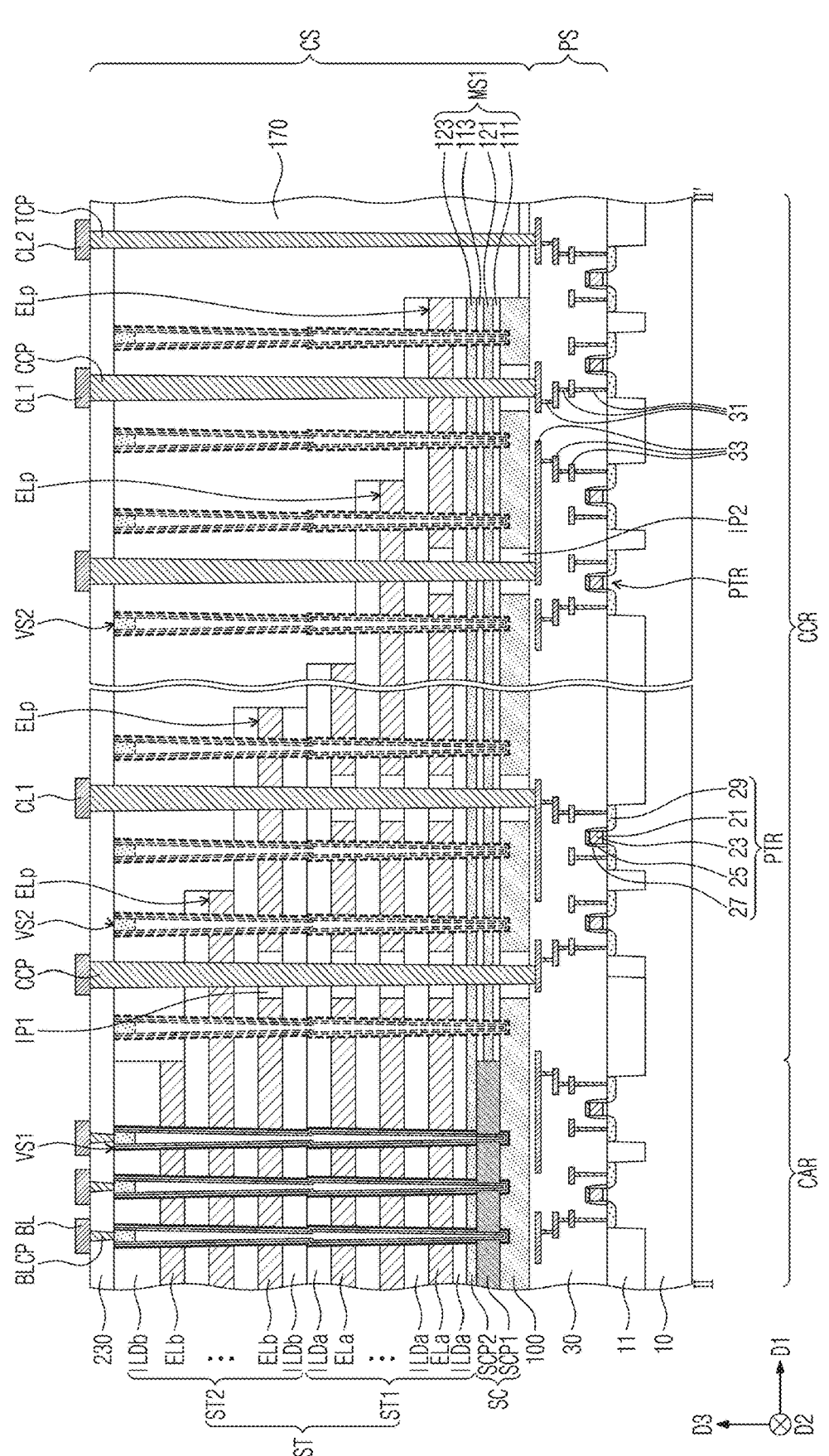
FIG. 18 illustrates a cross-sectional view taken along line II-II' of FIG. 5, showing a three-dimensional semiconductor memory device according to various example embodiments.

FIG. 18 illustrates a cross-sectional view taken along line II-II' of FIG. 5, showing a three-dimensional semiconductor memory device according to various example embodiments. For convenience of description, omission will be made to avoid a repetitive explanation of the same components discussed with reference to FIGS. 5, 6A, and 6B, and a difference thereof will be described in detail.

Referring to FIGS. 5 and 18, the cell contact plugs CCP may penetrate the third dielectric layer 230, the second dielectric layer 170, the stack structure ST, the first mold structure MS1, and the second substrate 100 to come into electrical connection with the peripheral circuit transistors PTR of the peripheral circuit structure PS. The cell contact plugs CCP may have their bottom surfaces located at a level lower than that of a bottom surface of the stack structure ST. Each of the cell contact plugs CCP may be in contact with and electrically connected to one of the first and second gate electrodes ELa and ELb. The cell contact plugs CCP may be correspondingly in contact with the pad parts ELp at top sides of the first and second gate electrodes ELa and ELb that are shaped like a staircase.

The cell contact plugs CCP may be spaced apart in a horizontal direction and electrically separated from the gate electrodes ELa and ELb across first dielectric patterns IP1 disposed below the pad parts ELp, which horizontal direction is one direction on a plane parallel to a first direction D1 and a second direction D2. The cell contact plugs CCP may be spaced apart in the horizontal direction and electrically separated from the second substrate 100 across second dielectric patterns IP2.

The first and second dielectric patterns IP1 and IP2 may include the same material as that of the first and second interlayer dielectric layers ILDa and ILDb of the stack structure ST. The bottom surface of each of the cell contact plugs CCP may be located at a level lower than that of a bottom surface of the second substrate 100. A height in a third direction D3 of each of the cell contact plugs CCP may be substantially the same as a height in the third direction D3 of the peripheral contact plug TCP.

The formation of the cell contact plugs CCP and the peripheral contact plug TCP may include forming vertical holes that penetrate the third dielectric layer 230, the second dielectric layer 170, the stack structure ST, and the second substrate 100, and filling the vertical holes with a conductive material. The vertical holes in which are provided the cell contact plugs CCP and the peripheral contact plug TCP may be formed together with the vertical channel holes CH at the same time in the same etching process, and therefore an etching process for high aspect ratio may decrease in the degree of difficulty and the number of times.

Figure 19:
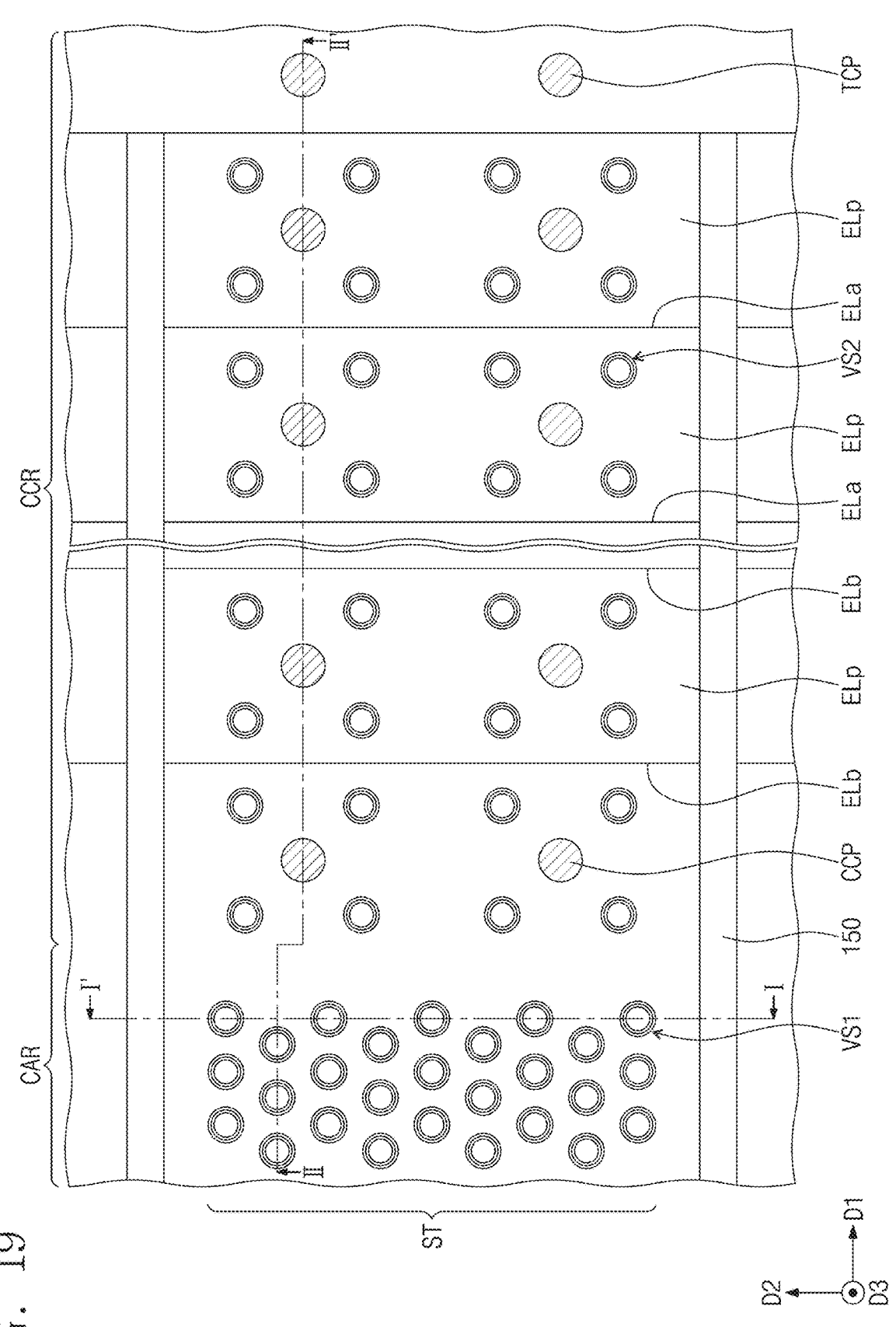
FIG. 19 illustrates a plan view showing a three-dimensional semiconductor memory device according to various example embodiments.
Figure 20A:
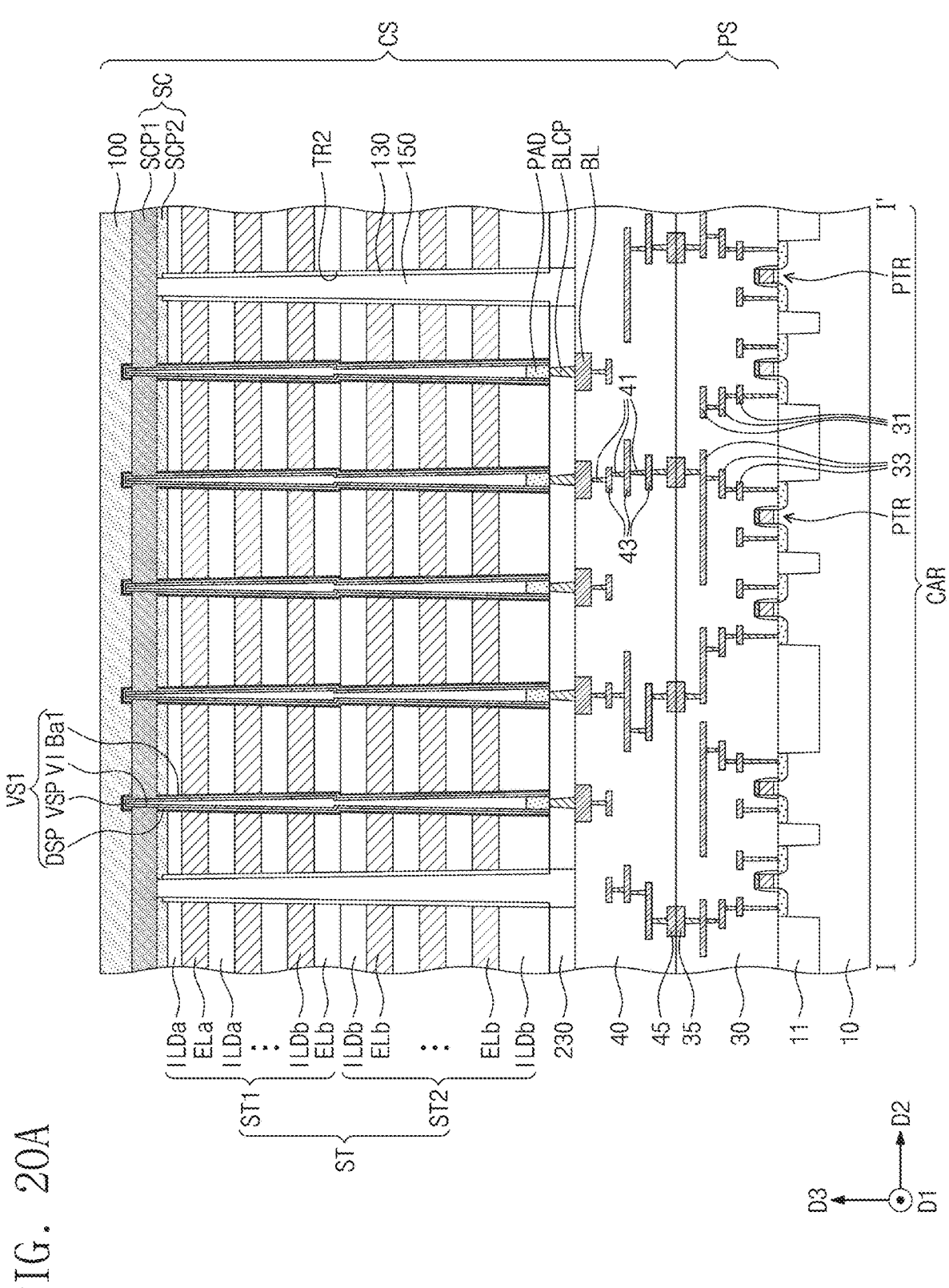
FIGS. 20A and 20B illustrate cross-sectional views respectively taken along lines I-I' and II-II' of FIG. 19, showing a three-dimensional semiconductor memory device according to various example embodiments.
Figure 20B:
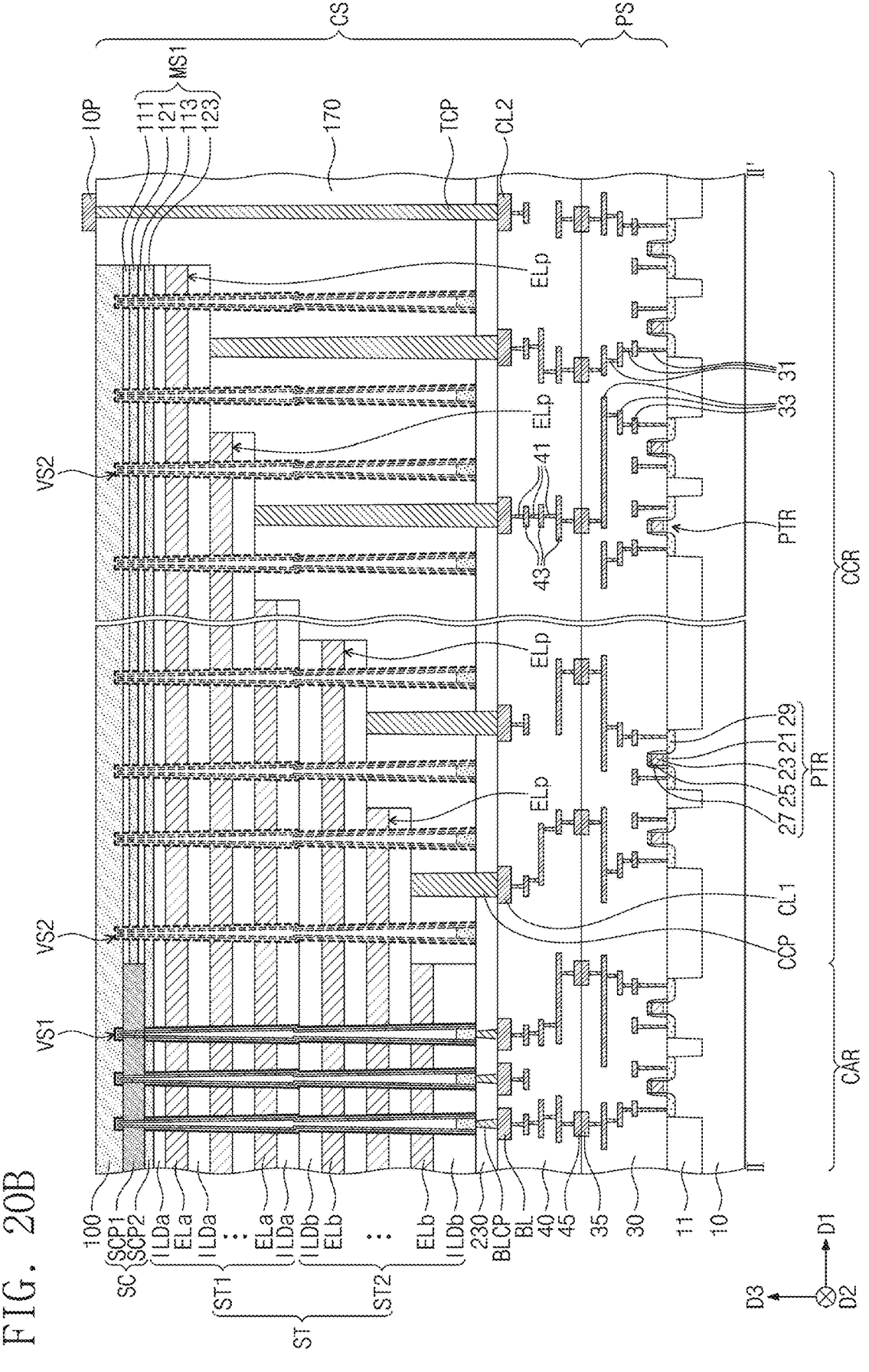

FIG. 19 illustrates a plan view showing a three-dimensional semiconductor memory device according to various example embodiments. FIGS. 20A and 20B illustrate cross-sectional views respectively taken along lines I-I' and II-II' of FIG. 19, showing a three-dimensional semiconductor memory device according to various example embodiments. For convenience of description, omission will be made to avoid a repetitive explanation of the same components discussed with reference to FIGS. 5, 6A, and 6B, and a difference thereof will be described in detail.

Referring to FIGS. 19, 20A, and 20B, a first substrate 10 may be provided thereon with a peripheral circuit structure PS including peripheral circuit transistors PTR, peripheral contact plugs 31, peripheral circuit lines 33 electrically connected through the peripheral contact plugs 31 to the peripheral circuit transistors PTR, first bonding pads 35 electrically connected to the peripheral circuit lines 33, and a first dielectric layer 30 that surrounds the peripheral circuit transistors PTR, the peripheral contact plugs 31, the peripheral circuit lines 33, and the first bonding pads 35. The first dielectric layer 30 may not cover top surfaces of the first bonding pads 35. The first dielectric layer 30 may have a top surface substantially coplanar with those of the first bonding pads 35.

The peripheral circuit structure PS may be provided thereon with a cell array structure CS including second bonding pads 45, a stack structure ST, and a second substrate 100. The second substrate 100 may be provided on the stack structure ST. The stack structure ST may be provided between the second substrate 100 and the peripheral circuit structure PS. In this case, the second substrate 100 may also be referred to as an upper substrate. The stack structure ST may be configured identically or similarly to that discussed with reference to FIGS. 5, 6A, and 6B.

The first dielectric layer 30 may be provided thereon with second bonding pads 45 in contact with the first bonding pads 35 of the peripheral circuit structure PS, connection contact plugs 41, connection circuit lines 43 electrically connected through the connection contact plugs 41 to the second bonding pads 45, and a fourth dielectric layer 40 that surrounds the second bonding pads 45, the connection contact plugs 41, and the connection circuit lines 43. The fourth dielectric layer 40 may include a plurality of dielectric layers that constitute a multi-layered structure. The fourth dielectric layer 40 may include, for example, one or more of silicon oxide, silicon nitride, silicon oxynitride, and low-k dielectrics. The connection contact plugs 41 may each have a width in the first direction D1 or the second direction D2 that decreases in the third direction D3 (or decreases with increasing distance from the first substrate 10). The connection contact plugs 41 and the connection circuit lines 43 may include a conductive material, such as metal.

The second dielectric layer 40 may not cover bottom surfaces of the second bonding pads 45. The fourth dielectric layer 40 may have a bottom surface substantially coplanar with those of the second bonding pads 45. The bottom surfaces of the second bonding pads 45 may be correspondingly in direct contact with the top surfaces of the first bonding pads 35. The first and second bonding pads 35 and 45 may include metal, such as copper (Cu), tungsten (W), aluminum (Al), nickel (Ni), or tin (Sn). For example, the first and second bonding pads 35 and 45 may include copper (Cu).

The first and second bonding pads 35 and 45 may constitute a single unitary shape without any interface therebetween. The first and second bonding pads 35 and 45 are illustrated to have their sidewalls aligned with each other, but the present inventive concepts are not limited thereto, and when viewed in plan, the first and second bonding pads 35 and 45 may have their sidewalls spaced apart from each other.

The fourth dielectric layer 40 may be provided in its upper portion with bit lines BL and first and second conductive lines CL1 and CL2 in contact with the connection contact plugs 41. A third dielectric layer 230 may be provided on the fourth dielectric layer 40, and the stack structure ST and a second dielectric layer 170 may be provided on the third dielectric layer 230.

The first gate electrodes ELa of the first stack structure ST1 and the second gate electrodes ELb of the second stack structure ST2 may have their length in the first direction D1 that increase with increasing distance from the first substrate 10. When viewed in plan as shown in FIG. 19, the first and second gate electrodes ELa and ELb may have their sidewalls that are spaced apart from each other at a regular interval along the first direction D1. A lowermost one of the second gate electrodes ELb included in the second stack structure ST2 may have a minimum length in the first direction D1, and an uppermost one of the first gate electrodes ELa included in the first stack structure ST1 may have a maximum length in the first direction D1. Likewise the first and second gate electrode ELa and ELb, first and second interlayer dielectric layers ILDa and ILDb may have their lengths in the first direction D1 that increase with increasing distance from the first substrate 10.

The bit-line contact plugs BLCP, the cell contact plugs CCP, the peripheral contact plug TCP, and the first and second vertical channel structures VS1 and VS2 may each have a width in the first direction D1 or the second direction D2 that decreases in the third direction D3. The separation structure 150 may have a width in the second direction D2 that decreases in the third direction D3.

The second dielectric layer 170 may be provided thereon with an input/output pad IOP electrically connected through the peripheral contact plug TCP to at least one of the peripheral circuit transistors PTR included in the peripheral circuit structure PS. The input/output pad IOP may correspond to the input/output pad 1101 of FIG. 1 or one of the input/output pads 2210 of FIG. 3 or 4.

As the cell array structure CS is bonded onto the peripheral circuit structure PS, it may be possible to increase a cell capacity per unit area of a three-dimensional semiconductor memory device according to the present inventive concepts. Alternatively or additionally, as the peripheral circuit structure PS and the cell array structure CS are manufactured separately and then bonded to each other, the peripheral transistors PTR may be prevented from, or reduced in likelihood of occurrence from and/or in impact from being damaged due to various heat treatment processes, and accordingly, it may be possible to improve reliability and electrical properties of a three-dimensional semiconductor memory device according to the present inventive concepts.

According to various example embodiments, as a first diffusion stop layer is provided between a first blocking dielectric layer and a charge storage layer, when an oxidation process is performed on the first blocking dielectric layer, diffusion of oxygen into the charge storage layer may be blocked to prevent or reduce oxidation of the charge storage layer. Alternatively or additionally, the charge storage layer may be prevented or reduced from receiving constituent materials (e.g., titanium or tungsten) diffusing from first and second gate electrodes.

Alternatively or additionally, as a second diffusion stop layer is provided between a second blocking dielectric layer and gate electrodes, nitrogen may be suppressed from being diffused from a second barrier pattern into the second blocking dielectric layer and thus the gate electrodes may be prevented or reduced from their short-circuit due to nitrogenization of the second blocking dielectric layer. Accordingly, a three-dimensional semiconductor memory device according to the inventive concepts may improve in reliability and/or electrical properties.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

Although inventive concepts have been described in connection with the various example embodiments illustrated in the accompanying drawings, it will be understood by one of ordinary skill in the art that variations in form and detail may be made therein without departing from the spirit and essential feature of inventive concepts. The above disclosed embodiments should thus be considered illustrative and not restrictive. Furthermore, example embodiments are not necessarily mutually exclusive with one another. For example, some example embodiments may include one or more features described with reference to one or more drawings, and may also include one or more other features described with reference to one or more other drawings.

What is claimed is:

1. A three-dimensional semiconductor memory device, comprising:
   a stack structure including interlayer dielectric layers and gate electrodes that are alternately and repeatedly stacked on a substrate, wherein the gate electrodes are between the interlayer dielectric layers;
   vertical channel structures in vertical channel holes that penetrate the stack structure, wherein each of the vertical channel structures includes a charge storage layer, a tunneling dielectric layer, and a vertical semiconductor pattern that sequentially cover an inner sidewall of each of the vertical channel holes; and
   a diffusion stop layer between the gate electrodes and the charge storage layer, wherein the diffusion stop layer includes a non-oxide dielectric material having a dielectric constant of greater than about 0 and less than about 5.

2. The device of claim 1, wherein
   the vertical channel structures further include a blocking dielectric layer that covers the inner sidewall of each of the vertical channel holes, and
   the diffusion stop layer is between the blocking dielectric layer and the charge storage layer.

3. The device of claim 2, wherein a thickness of the diffusion stop layer is greater than about 0 Angstroms (Å) and less than about 10 Å.

4. The device of claim 2, wherein
   the stack structure further includes a source structure between the substrate and a lowermost one of the interlayer dielectric layers,
   the source structure includes a first source conductive pattern and a second source conductive pattern that are sequentially stacked on the substrate,
   the first source conductive pattern contacts the vertical semiconductor pattern, and
   the diffusion stop layer contacts the first source conductive pattern.

5. The device of claim 2, wherein the diffusion stop layer at least partially covers an inner sidewall of the charge storage layer.

6. The device of claim 2, wherein the diffusion stop layer contacts the blocking dielectric layer.

7. The device of claim 1, further comprising:
   a blocking dielectric layer between the gate electrodes and the charge storage layer,
   wherein the diffusion stop layer is between the gate electrodes and the blocking dielectric layer.

8. The device of claim 7, wherein each of the diffusion stop layer and the blocking dielectric layer extends onto a top surface and a bottom surface of each of the gate electrodes.

9. The device of claim 8, wherein
   the diffusion stop layer and the blocking dielectric layer include different materials from each other, and
   the diffusion stop layer contacts the blocking dielectric layer.

10. The device of claim 1, further comprising:
   an upper substrate on the stack structure, wherein
   the stack structure is between the substrate and the upper substrate,
   a portion of at least one of the vertical channel structures is inserted into the upper substrate, and
   the gate electrodes have lengths in a first direction that increase with increasing distance from the substrate, the first direction being parallel to a top surface of the substrate.

11. The device of claim 1, wherein the non-oxide dielectric material includes boron nitride (BN).

12. The device of claim 11, wherein the boron nitride (BN) has at least one of a hexagonal crystal structure, a cubic crystal structure, and a wurtzite crystal structure.

13. A three-dimensional semiconductor memory device, comprising:
   a stack structure including interlayer dielectric layers and gate electrodes that are alternately and repeatedly stacked on a substrate, wherein the gate electrodes are between the interlayer dielectric layers;
   vertical channel structures in vertical channel holes that penetrate the stack structure, wherein each of the vertical channel structures includes a first blocking dielectric layer, a first diffusion stop layer, a charge storage layer, a tunneling dielectric layer, and a vertical semiconductor pattern that sequentially cover an inner sidewall of each of the vertical channel holes; and a second diffusion stop layer and a second blocking dielectric layer between the gate electrodes and the first blocking dielectric layer, wherein each of the first blocking dielectric layer and the second blocking dielectric layer includes an oxide dielectric layer, and each of the first diffusion stop layer and the second diffusion stop layer includes a non-oxide dielectric layer.

14. The device of claim 13, wherein each of the second diffusion stop layer and the second blocking dielectric layer extends onto a top surface and a bottom surface of each of the gate electrodes.

15. The device of claim 13, wherein
the first blocking dielectric layer includes silicon oxide,
the second blocking dielectric layer includes at least one of aluminum oxide and hafnium oxide, and
the first diffusion stop layer and the second diffusion stop layer include boron nitride (BN).

16. The device of claim 13, wherein
the stack structure further includes a source structure between the substrate and a lowermost one of the interlayer dielectric layers,
the source structure includes a first source conductive pattern and a second source conductive pattern that are sequentially stacked on the substrate,
the first source conductive pattern contacts the vertical semiconductor pattern, and
the first diffusion stop layer contacts the first source conductive pattern.

17. The device of claim 16, wherein the second diffusion stop layer is spaced apart from the source structure.

18. The device of claim 13, further comprising:
an upper substrate on the stack structure, wherein the stack structure is between the substrate and the upper substrate, a portion of at least one of the vertical channel structures is inserted into the upper substrate, and wherein the gate electrodes have lengths in a first direction that increase with increasing distance from the substrate, the first direction being parallel to a top surface of the substrate.

19. An electronic system, comprising:

a three-dimensional semiconductor memory device including a substrate, a peripheral circuit structure on the substrate, and a cell array structure on the peripheral circuit structure; and a controller electrically connected through an input/output pad to the three-dimensional semiconductor memory device, wherein the controller is configured to control the three-dimensional semiconductor memory device, wherein the cell array structure includes:

a stack structure including interlayer dielectric layers and gate electrodes that are alternately and repeatedly stacked on the peripheral circuit structure, wherein the gate electrodes are between the interlayer dielectric layers;

vertical channel structures in vertical channel holes that penetrate the stack structure, wherein each of the vertical channel structures includes a charge storage layer, a tunneling dielectric layer, and a vertical semiconductor pattern that sequentially cover an inner sidewall of each of the vertical channel holes; and a diffusion stop layer between the gate electrodes and the charge storage layer, wherein the diffusion stop layer includes a non-oxide dielectric layer having a dielectric constant of greater than about 0 and less than about 5.

20. The electronic system of claim 19, wherein the diffusion stop layer includes boron nitride (BN).

* * * * *